(12) United States Patent
Yamada

(10) Patent No.: US 12,216,275 B2
(45) Date of Patent: Feb. 4, 2025

(54) OPTICAL ELEMENT, IMAGE DISPLAY DEVICE, VIRTUAL REALITY DISPLAY DEVICE, ELECTRONIC VIEWFINDER, METHOD OF PRODUCING POLARIZER

(71) Applicant: FUJIFILM Corporation, Tokyo (JP)

(72) Inventor: Naoyoshi Yamada, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 18/538,749

(22) Filed: Dec. 13, 2023

(65) Prior Publication Data
US 2024/0134187 A1    Apr. 25, 2024

Related U.S. Application Data

(60) Division of application No. 18/060,320, filed on Nov. 30, 2022, now Pat. No. 11,914,140, which is a
(Continued)

(30) Foreign Application Priority Data

Jun. 1, 2020   (JP) .................. 2020-095644
May 25, 2021  (JP) .................. 2021-087725

(51) Int. Cl.
*G02B 5/30*   (2006.01)
*B29D 11/00*  (2006.01)
(Continued)

(52) U.S. Cl.
CPC .... *G02B 27/0018* (2013.01); *B29D 11/00644* (2013.01); *G02B 5/3016* (2013.01); *G02B 23/14* (2013.01); *G06F 1/163* (2013.01)

(58) Field of Classification Search
CPC .. G02B 27/0018; G02B 5/3016; G02B 23/14; B29D 11/00644; G06F 1/163
See application file for complete search history.

(56) References Cited

U.S. PATENT DOCUMENTS 5,517,366 A    5/1996  Togino
6,421,183 B1   7/2002  Ophey
(Continued)

FOREIGN PATENT DOCUMENTS

JP    07-120679 A    5/1995
JP    2003-504663 A  2/2003
(Continued)

OTHER PUBLICATIONS

International Search Report issued in PCT/JP2021/020231 on Jul. 13, 2021.
(Continued)

*Primary Examiner* — James A Dudek
(74) *Attorney, Agent, or Firm* — Edwards Neils LLC; Jean C. Edwards, Esq.

(57) ABSTRACT

A method of producing an absorbing polarizer which has a plurality of regions where directions of absorption axes are different from each other and has a curved surface portion. The method includes a step of forming a layer of a composition for forming a photo-alignment film that contains a photo-alignment agent on a surface of a resin base material, a step of forming the alignment film by irradiating the layer with ultraviolet rays of linearly polarized light via a lens, and aligning the photo-alignment agent, and a step of coating a surface of an alignment film with a composition containing a liquid crystal compound and a dichroic substance. The alignment film has a curved surface portion and a plurality of regions where directions of an alignment regulating force are different from each other.

11 Claims, 3 Drawing Sheets

Related U.S. Application Data continuation of application No. PCT/JP2021/020231, filed on May 27, 2021.

(51) Int. Cl.
  *G02B 23/14* (2006.01)
  *G02B 27/00* (2006.01)
  *G06F 1/16* (2006.01)

(56) References Cited

U.S. PATENT DOCUMENTS

| | | | |
|---|---|---|---|
| 10,007,035 | B2 | 6/2018 | Ouderkirk et al. |
| 10,712,485 | B1 | 7/2020 | Lam et al. |
| 2009/0097117 | A1* | 4/2009 | Coleman ............ B29D 11/0073 359/489.19 |
| 2010/0177113 | A1 | 7/2010 | Gay et al. |
| 2012/0107530 | A1* | 5/2012 | Morishima ............ G02B 30/25 359/463 |
| 2015/0301250 | A1 | 10/2015 | Kim et al. |
| 2017/0068029 | A1 | 3/2017 | Yun et al. |
| 2018/0039052 | A1 | 2/2018 | Khan et al. |
| 2019/0384045 | A1 | 12/2019 | Yun et al. |
| 2020/0081234 | A1 | 3/2020 | Etter et al. |

FOREIGN PATENT DOCUMENTS

| | | |
|---|---|---|
| JP | 2006-113180 A | 4/2006 |
| JP | 2010-526321 A | 7/2010 |
| JP | 2016-502147 A | 1/2016 |
| JP | 2018-500584 A | 1/2018 |
| JP | 2018-511065 A | 4/2018 |
| JP | 2019-526075 A | 9/2019 |
| WO | 2007/074533 A1 | 7/2007 |
| WO | 2020/240354 A1 | 12/2020 |
| WO | 2021/111861 A1 | 6/2021 |

OTHER PUBLICATIONS

Written Opinion issued in PCT/JP2021/020231 on Jul. 13, 2021.
International Preliminary Report on Patentability completed by WIPO on Dec. 6, 2022 in connection with International Patent Application No. PCT/JP2021/020231.
Office Action, issued by the Japanese Patent Office on Dec. 26, 2023, in connection with Japanese Patent Application No. 2022-528779.

* cited by examiner

OPTICAL ELEMENT, IMAGE DISPLAY DEVICE, VIRTUAL REALITY DISPLAY DEVICE, ELECTRONIC VIEWFINDER, METHOD OF PRODUCING POLARIZER

CROSS-REFERENCE TO RELATED APPLICATIONS

The present application is a Divisional of U.S. application Ser. No. 18/060,320, filed Nov. 30, 2022, which is a Continuation of PCT International Application No. PCT/JP2021/020231 filed on May 27, 2021, which was published under PCT Article 21(2) in Japanese, and which claims priority under 35 U.S.C. § 119(a) to Japanese Patent Application No. 2020-095644, filed on Jun. 1, 2020, and Japanese Patent Application No. 2021-087725, filed on May 25, 2021. The above applications are hereby expressly incorporated by reference, in their entirety, into the present application.

BACKGROUND OF THE INVENTION

1. Field of the Invention

The present invention relates to an optical element, an image display device, a virtual reality display device, an electronic viewfinder, and a method of producing a polarizer.

2. Description of the Related Art

Absorbing polarizers have been widely used as image display devices such as liquid crystal display devices and organic EL display devices, and these polarizers have in-plane absorption axes that are mostly aligned (linearly).

Meanwhile, in recent years, in image display devices such as virtual reality display devices and electronic viewfinders, image display devices formed of a reciprocation optical system described in JP1995-120679A (JP-H7-120679A) have been suggested for the purpose of reducing the size and the thickness of a display unit. In such virtual image display devices, an absorbing polarizer is used on a viewing side in order to suppress undesirable images such as ghosts (hereinafter, also simply referred to as "ghosts") caused by stray light. Here, it is desirable that the above-described polarizer also has a curved surface according to the shape of a lens.

SUMMARY OF THE INVENTION

As a result of examination conducted by the present inventors, it was found that even in a case where an absorbing polarizer having a curved surface is installed on the viewing side in an image display device formed of a reciprocation optical system, stray light cannot be sufficiently suppressed, and ghosts are displayed.

The present invention has been made in view of the above-described problems, and an object of the present invention is to provide an optical element having an excellent effect of suppressing ghosts in a case where an absorbing polarizer having a curved surface portion is applied to an image display device formed of a reciprocation optical system. Further, another object of the present invention is to provide an image display device, a virtual reality display device, an electronic viewfinder, and a method of producing a polarizer.

As a result of intensive examination on the above-described problem, the present inventors found that the above-described problem can be solved by the following configurations.

[1] An optical element comprising: an absorbing polarizer A having a curved surface portion; and an absorbing polarizer B, in which in a case where a position of a surface of the polarizer A on a side of the polarizer B, closest to the side of the polarizer B, is defined as a position X, a position of a surface of the polarizer B on a side of the polarizer A, closest to the position X, is defined as a position Y, and a straight line L passing through the position X and the position Y is drawn, a position Z satisfying a specific requirement is present on the straight line L and at a position beyond the position X in a case where the position X is observed from the position Y.

[2] The optical element according to [1], in which the polarizer A has a region where directions of absorption axes are different from each other.

[3] The optical element according to [1] or [2], in which the polarizer A includes a light absorption anisotropic layer containing a liquid crystal compound and a dichroic substance.

[4] The optical element according to [3], in which the polarizer A further includes a photo-alignment film.

[5] An image display device comprising: the optical element according to any one of [1] to [4]; and an image display element.

[6] The image display device according to [5], in which a reflective linear polarizer, a first λ/4 plate, a half mirror, and a second λ/4 plate are provided between the polarizer A and the polarizer B in order from a side of the polarizer A, the direction of the absorption axis of the polarizer A at the position X is parallel to a direction of a reflection axis of the reflective linear polarizer at an intersection of the straight line L and the reflective linear polarizer in a case of being observed in a direction in which the straight line L extends, and directions of the absorption axis of the polarizer A at intersections of virtual lines L1 to L4 and the polarizer A are respectively parallel to directions of the reflection axis of the reflective linear polarizer at intersections of the virtual lines L1 to L4 and the reflective linear polarizer in a case of being observed from directions in which the virtual lines L1 to L4 extend.

[7] The image display device according to [6], in which an angle between the direction of the absorption axis of the polarizer A at the position X and a direction of a slow axis of the first λ/4 plate at an intersection of the straight line L and the first λ/4 plate is 45±10° in a case of being observed in a direction in which the straight line L extends, and angles between directions of the absorption axis of the polarizer A at intersections of virtual lines L1 to L4 and the polarizer A and directions of the slow axis of the first λ/4 plate at intersections of the virtual lines L1 to L4 and the first λ/4 plate are respectively 45±10° in a case of being observed from directions in which the virtual lines L1 to L4 extend.

[8] The image display device according to [6] or [7], in which a direction of a slow axis of the first λ/4 plate at an intersection of the straight line L and the first λ/4 plate is orthogonal to a direction of a slow axis of the second λ/4 plate at an intersection of the straight line L and the second λ/4 plate in a case of being observed in a direction in which the straight line L extends, and directions of the slow axis of the first λ/4 plate at intersections of the virtual lines L1 to L4 and the first λ/4 plate are respectively orthogonal to directions of the slow axis of the second λ/4 plate at intersections of the virtual lines L1 to L4 and the second λ/4 plate in a case of being observed from directions in which the virtual lines L1 to L4 extend.

[9] The image display device according to [5], in which a first λ/4 plate, a reflective circular polarizer, a half mirror, and a second λ/4 plate are provided between the polarizer A and the polarizer B in order from a side of the polarizer A, an angle between the direction of the absorption axis of the polarizer A at the position X and a direction of a slow axis of the first λ/4 plate at an intersection of the straight line L and the first λ/4 plate is 45±10° in a case of being observed in the direction in which the straight line L extends, and angles between directions of the absorption axis of the polarizer A at intersections of virtual lines L1 to L4 and the polarizer A and directions of the slow axis of the first λ/4 plate at intersections of the virtual lines L1 to L4 and the first λ/4 plate are respectively 45±10° in a case of being observed from directions in which the virtual lines L1 to L4 extend.

[10] The image display device according to [9], in which the reflective circular polarizer has a cholesteric liquid crystal layer.

[11] The image display device according to any one of [5] to [10], in which the polarizer B is laminated on the image display element.

[12] A virtual reality display device comprising: the image display device according to any one of [5] to [11].

[13] An electronic viewfinder comprising: the image display device according to any one of [5] to [11].

[14] A method of producing an absorbing polarizer which has a plurality of regions where directions of absorption axes are different from each other and has a curved surface portion, the method comprising: a step of spray-coating a surface of an alignment film with a composition containing a liquid crystal compound and a dichroic substance, in which the alignment film has a curved surface portion and a plurality of regions where directions of an alignment regulating force are different from each other.

[15] The method of producing a polarizer according to [14], further comprising: a step of forming the alignment film by forming a layer of a composition for forming a photo-alignment film that contains a photo-alignment agent on a surface of a resin base material, subsequently irradiating the layer with ultraviolet rays of linearly polarized light via a lens, and aligning the photo-alignment agent.

According to the present invention, it is possible to provide an optical element having an excellent effect of suppressing ghosts in a case where an absorbing polarizer having a curved surface portion is applied to a virtual image display device formed of a reciprocation optical system. Further, according to the present invention, it is possible to provide an image display device, a virtual reality display device, an electronic viewfinder, and a method of producing a polarizer.

DESCRIPTION OF THE PREFERRED EMBODIMENTS

Hereinafter, the present invention will be described in detail with reference to the accompanying drawings. The description of configuration requirements below may be made based on typical embodiments or specific examples, but the present invention is not limited to such embodiments.

In the present specification, a numerical range shown using "to" indicates a range including numerical values described before and after "to" as a lower limit and an upper limit.

In the present specification, the term "orthogonal" does not denote 90° in a strict sense, but denotes 90°±10° and preferably 90°±5°. Further, the term "parallel" does not denote 0° in a strict sense, but denotes 0°±10° and preferably 0°±5°. Further, the angle "45°" does not denote 45° in a strict sense, but denotes 45°±10° and preferably 45°±5°.

In the present specification, the term "absorption axis" denotes a direction in which the absorbance is maximized in the plane. Further, the term "reflection axis" denotes a direction in which the reflectivity is maximized in the plane. Further, the term "slow axis" denotes a direction in which the refractive index is maximum in the plane.

In the present specification, the term "local" in a case of notation of "local absorption axis" or the like does not denote an azimuth of an average absorption axis over the entire region of the film but denotes an azimuth of a local absorption axis at one point of interest.

Optical Element

An optical element according to the embodiment of the present invention (hereinafter, also referred to as "present optical element") is an optical element including an absorbing polarizer A having a curved surface portion, and an absorbing polarizer B, and a position Z satisfying the following requirements is present on the straight line L connecting a specific position X of the polarizer A and the specific position Y of the polarizer B.

Figure 1:
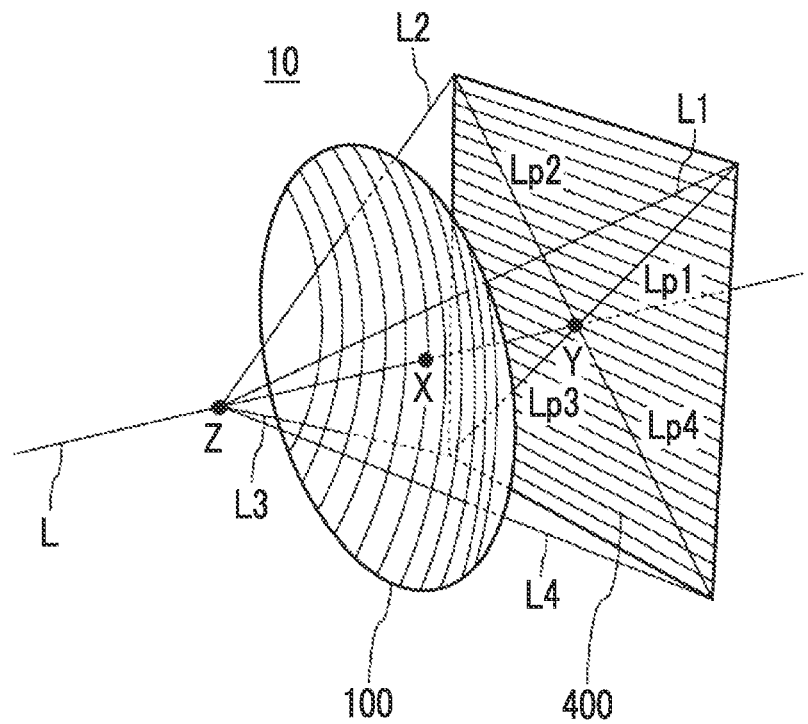
FIG. 1 is a schematic view illustrating an example of a configuration of an optical element according to the present invention.

FIG. 1 illustrates an example of the configuration of the optical element according to the embodiment of the present invention.

An optical element 10 illustrated in FIG. 1 includes a polarizer A100 and a polarizer B400. The polarizer A100 is an absorbing polarizer having a curved surface, and the polarizer B400 is a planar absorbing polarizer.

As illustrated in FIG. 1, in the optical element 10, in a case where a position of a surface of the polarizer A on a side of the polarizer B, closest to the side of the polarizer B, is defined as a position X, a position of a surface of the polarizer B on a side of the polarizer A, closest to the position X, is defined as a position Y, and a straight line L passing through the position X and the position Y is drawn, a position Z satisfying the following requirements (hereinafter, also referred to as "specific requirements") is present on the straight line L and at a position beyond the position X as the position X is observed from the position Y.

(Specific Requirements)
(a) A virtual line L1, a virtual line L2, a virtual line L3, and a virtual line L4, which pass through the position Z and form an angle of 30° with the straight line L, are present.
(b) An angle between a straight line Lp1 in which the virtual line L1 is orthographically projected onto the polarizer B and a straight line Lp2 in which the virtual line L2 is orthographically projected onto the polarizer B is 90°, an angle between the straight line Lp2 and a straight line Lp3 in which the virtual line L3 is orthographically projected onto the polarizer B is 90°, an angle between the straight line Lp3 and a straight line Lp4 in which the virtual line L4 is orthographically projected onto the polarizer B is 90°, and an angle between the straight line Lp4 and the straight line Lp1 is 90°.

(c) An angle between the straight line Lp1 and an absorption axis of the polarizer B is 45°.

(d) A direction of an absorption axis of the polarizer A at the position X and a direction of the absorption axis of the polarizer B at the position Y are orthogonal to each other in a case of being observed in the direction in which the straight line L extends.

(e) A direction of the absorption axis of the polarizer A at an intersection of the virtual line L1 and the polarizer A and a direction of the absorption axis of the polarizer B at an intersection of the virtual line L1 and the polarizer B are orthogonal to each other in a case of being observed in a direction in which the virtual line L1 extends.

(f) A direction of the absorption axis of the polarizer A at an intersection of the virtual line L2 and the polarizer A and a direction of the absorption axis of the polarizer B at an intersection of the virtual line L2 and the polarizer B are orthogonal to each other in a case of being observed in a direction in which the virtual line L2 extends.

(g) A direction of the absorption axis of the polarizer A at an intersection of the virtual line L3 and the polarizer A and a direction of the absorption axis of the polarizer B at an intersection of the virtual line L3 and the polarizer B are orthogonal to each other in a case of being observed in a direction in which the virtual line L3 extends.

(h) A direction of the absorption axis of the polarizer A at an intersection of the virtual line L4 and the polarizer A and a direction of the absorption axis of the polarizer B at an intersection of the virtual line L4 and the polarizer B are orthogonal to each other in a case of being observed in a direction in which the virtual line L4 extends.

As a result of intensive examination on the above-described objects, the present inventors found that, in the optical element including the absorbing polarizer A having a curved surface and the absorbing polarizer B, an effect of suppressing ghosts can be improved in an image display device formed of an absorbing polarizer having a curved surface portion by adjusting each configuration of the polarizer A and the polarizer B such that the position Z satisfying the above-described specific requirements is present and particularly specifying a local azimuth of an absorption axis of the polarizer A.

The present inventor considered the following reasons why ghosts cannot be sufficiently suppressed in a case where an absorbing polarizer having a curved surface portion on a viewing side is installed in an image display device formed of a reciprocation optical system of the related art.

Figure 2:
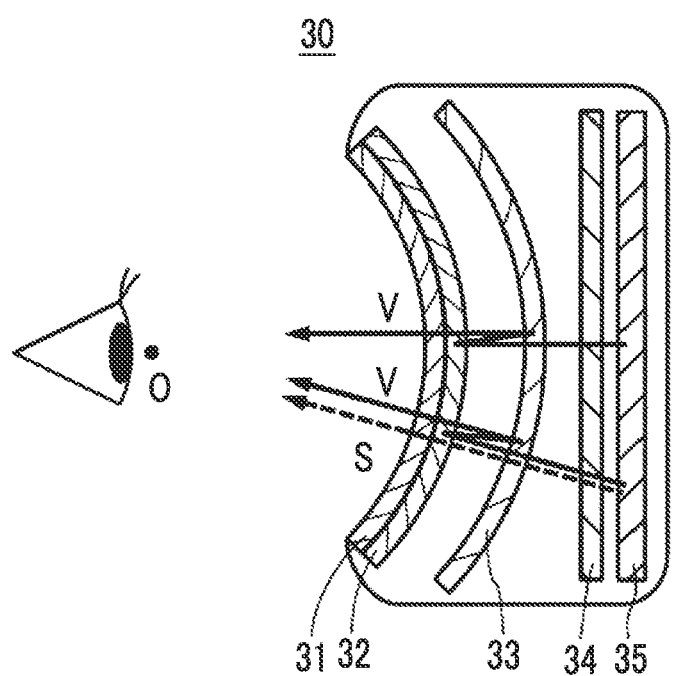
FIG. 2 is a schematic view illustrating an example of a configuration of an image display device formed of a reciprocation optical system of the related art.

Hereinafter, the above-described reason and effects of the optical element according to the embodiment of the present invention will be described. FIG. 2 is a schematic view illustrating an example of a configuration of an image display device formed of a reciprocation optical system of the related art.

An image display device 30 of the related art illustrated in FIG. 2 an absorbing polarizer 31 having at least a curved surface, a reflective polarizer 32, a half mirror 33, an absorbing polarizer 34, and an image display element 35 in order from a side of a viewpoint O of an observer (viewing side). Further, the image display device 30 also includes a retardation plate such as a λ/4 plate (not illustrated). In a case where the image display device 30 is used, a ray V emitted from the image display element 35 is reflected by the reflective polarizer 32 and the half mirror 33 as illustrated in FIG. 2, reciprocates inside the optical system, is allowed to pass through the reflective polarizer 32 and the absorbing polarizer 34, and is then emitted from a lens (not illustrated) on the viewing side. The reciprocation of the ray V as described above can make the optical distance be extended and contributes to a decrease in size and a decrease in thickness of the optical system. As described above, the reciprocation optical system of the related art is designed with the intention that the ray V is appropriately reflected, polarized, and converted.

However, according to the examination of the present inventor, it was found that most of the ghosts visually recognized in an image display device formed of a reciprocation optical system are not caused by the ray V reciprocating inside the optical system, but by a ray S (see FIG. 2) that passes through the reflective polarizer 32 without reciprocating and directly reaches the observer's viewpoint O. In particular, in a case where the degree of polarization of the reflective polarizer 32 is not sufficient, the amount of ray S transmitted through the reflective polarizer 32 without being reflected tends to increase. The transmission of the ray S can be suppressed by the absorbing polarizer 31 disposed on the viewing side. However, it was found that since the absorbing polarizer 31 has a curved surface, the ray S cannot be sufficiently shielded and ghosts cannot be sufficiently suppressed in some cases due to the reason that the local absorption axis of the absorbing polarizer 31 at an intersection of a straight line connecting the viewpoint O and the absorbing polarizer 34 and the absorbing polarizer 31 is not orthogonal to the local absorption axis of the absorbing polarizer 34 at an intersection of the absorbing polarizer 34 and the straight line in a strict sense.

Further, it was found that in a case where an image closer to a peripheral portion of the image display element 35 is visually recognized from the observer's viewpoint O, that is, in a case where an angle between the visual line (=ray S) as an image is visually recognized from the viewpoint O and the normal line of the display surface of the image display element 35 increases, occurrence of ghosts due to the ray S is more significant.

Meanwhile, in the optical element 10 according to the embodiment of the present invention, as illustrated in FIG. 1, the polarizer A100 and the polarizer B400 are configured such that a position Z where the straight line L in which the angle between the absorption axis of the polarizer A100 at each intersection on the straight line and the absorption axis of the polarizer B400 is 90° and the virtual lines L1 to L4 intersect each other, at a position separated from the side of the polarizer A100. Therefore, the ray S emitted without reciprocating inside the optical system in the absorbing polarizer A100 having a curved surface portion can be suppressed, and occurrence of ghosts on a display image to be observed can be suppressed by performing observation from the position Z in a case of using the optical element 10 in an image display device.

In particular, the above-described excellent effects are more significantly exhibited in a case of suppressing occurrence of ghosts on an image display region closer to the peripheral portion of the image display element.

[Method of Specifying Position Z]

The position Z in the optical element can be specified, for example, by the following method.

First, in the optical element, the position X which is a position of a surface of the polarizer A on a side of the polarizer B, closest to the side of the polarizer B is searched. Subsequently, the position Y which is a position of a surface of the polarizer B closest to the position X, on a side of the polarizer A is searched. Based on the confirmed positions X and Y, the straight line L passing through the positions X and Y is determined. In other words, a perpendicular line drawn from the position X to the polarizer B is the straight line L, and an intersection of the perpendicular line and the surface of the polarizer B on the side of the polarizer A is the position Y. Further, the position Y is positioned at the center of the polarizer B in FIG. 1.

Next, in a case of assuming a point W that is present on the straight line L and is positioned beyond the position X as the position X is observed from the position Y, virtual lines Lw1, Lw2, Lw3, and Lw4 that pass through the point W, form an angle of 30° with the straight line L, and satisfy the following requirements are acquired.

Requirement: An angle between a line Lp1 in which the virtual line Lw1 is orthographically projected onto the polarizer B and a line Lp2 in which the virtual line Lw2 is orthographically projected onto the polarizer B is 90°, an angle between the line Lp2 and a line Lp3 in which the virtual line Lw3 is orthographically projected onto the polarizer B is 90°, an angle between the line Lp3 and a line Lp4 in which the virtual line Lw4 is orthographically projected onto the polarizer B is 90°, an angle between the line Lp4 and the line Lp1 is 90°, and an angle between the line Lp1 and the absorption axis of the polarizer B is 45°.

Next, the absorption axis of the polarizer A at the intersection of the virtual line Lw1 and the polarizer A and the absorption axis of the polarizer B at the intersection of the virtual line Lw1 and the polarizer B are measured using AxoScan OPMF-1 (manufactured by Opto Science, Inc.). During the measurement of the absorption axis of the polarizer A, the absorption axis is measured by removing the polarizer B from the optical element and fixing the polarizer A such that the direction of the measurement beam of AxoScan coincides with the virtual line Lw1 and the positional relationship between the virtual line Lw1 and the polarizer A does not change. Similarly, during the measurement of the absorption axis of the polarizer B, the absorption axis is measured by removing the polarizer A from the optical element and fixing the polarizer B such that the direction of the measurement beam of AxoScan coincides with the virtual line Lw1 and the positional relationship between the virtual line Lw1 and the polarizer B does not change.

Both measured values are compared to each other to determine whether the angle between the absorption axis of the polarizer A at the intersection of the virtual line Lw1 and the polarizer A and the absorption axis of the polarizer B at the intersection of the virtual line Lw1 and the polarizer B is 90° as observed in a direction in which the virtual line Lw1 extends.

Similar measurements and determinations are also made for the straight line L and the virtual lines Lw2 to Lw4.

While the position of the point W is moved on the straight line L, the setting of the virtual lines Lw1 to Lw4 and the measurement of the absorption axes of the polarizers A and B at the intersections with the virtual lines are repeatedly performed by the above-described method. As a result, for all of the straight line L and the virtual lines Lw1 to Lw4, in a case where the angle between the absorption axis of the polarizer A and the absorption axis of the polarizer B as observed in the observation direction is 90°, the point W is specified as the position Z. Further, the virtual lines Lw1 to Lw4 passing through the point W (position Z) in this case respectively correspond to the virtual lines L1 to L4 defined by the above-described specific requirements.

In regard to the present optical element, all the virtual line L1, the virtual line L2, the virtual line L3, and the virtual line L4 are all different from each other, and all the straight line Lp1, the straight line Lp2, the straight line Lp3, and the straight line Lp4 are all different from each other.

Hereinafter, the present optical element will be described in detail below.

The absorbing polarizer A having a curved surface portion and the absorbing polarizer B of the present optical element are not particularly limited as long as the polarizer A and the polarizer B are configured such that the position Z where both the polarizer A and the polarizer B satisfy specific requirements is present.

In the present specification, the expression "polarizer has a curved surface portion" denotes that at least a part of the polarizer is formed of a curved surface.

It is preferable that the entire polarizer A is formed of a curved surface. Further, it is preferable that the polarizer A has a three-dimensional curved surface and more preferable that the entire polarizer A is formed of a three-dimensional curved surface. Further, the three-dimensional curved surface denotes a curved surface that is not a developable surface. The developable surface denotes a curved surface that can be developed into a plane without expansion or contraction, that is, a curved surface that can be created by bending or cutting a plane.

Further, the polarizer A has preferably a rotary surface in which the surface on the side of the polarizer B is a convex surface and the surface on the side opposite to the side of the polarizer B is a concave surface and more preferably a curved surface with a constant curvature radius. Here, the expression "with a constant curvature radius" denotes that a difference between the maximum value and the minimum value of the curvature radius on the surface of the optical member such as the polarizer A is within 5% of the minimum value of the curvature radius.

Further, the curvature radius of the polarizer A in a case where the polarizer A has a curved surface with a constant curvature radius can be appropriately selected depending on the size and the applications of the optical element and the image display device, but is preferably in a range of 20 to 1000 mm and more preferably 30 to 200 mm.

The polarizer B may be planar or may have a curved surface portion. In the case where the polarizer B has a curved surface portion, the preferable aspects thereof may be the same as the preferable aspects of the polarizer A.

In a case of assuming the straight line Lz connecting the position Z and the polarizer B, it is preferable that the present optical element satisfies the relationship between the position Z in which an angle between a local absorption axis of the polarizer A at the intersection of the straight line Lz and the polarizer A and a local absorption axis of the polarizer B at the intersection of the straight line Lz and the polarizer B is 90° as observed in a direction in which the straight line Lz extends, the polarizer A, and the polarizer B, over the entire region of the polarizer B. By satisfying the above-described relationship over the entire region of the polarizer B, ghosts occurring in a display image can be more effectively suppressed in the image display device prepared by using the present optical element.

Further, the measurement of whether or not the optical element satisfies the above-described relationship can be carried out in conformity with the method of specifying the position Z described above.

Hereinafter, each of the polarizer A and the polarizer B will be described in detail.

[Polarizer A]

The polarizer A is an absorbing polarizer. A known absorbing polarizer having at least a light absorption anisotropic layer that contains a dichroic substance can be used as the polarizer A.

Examples of the light absorption anisotropic layer include a layer containing a matrix compound and a dichroic substance. Among these, a layer containing a liquid crystal compound and a dichroic substance is preferable.

The alignment degree of the dichroic substance in the light absorption anisotropic layer is preferably 0.95 or greater and more preferably 0.97 or greater. Ghosts can be effectively suppressed as the alignment degree increases. The upper limit of the alignment degree is not particularly limited, and may be 0.99 or less and preferably 0.98 or less.

It is preferable that the polarizer A has a plurality of regions where directions of absorption axes are different from each other. That is, it is preferable that the polarizer A has two or more regions where directions of local absorption axes are not parallel to each other in the plane.

Figure 3:
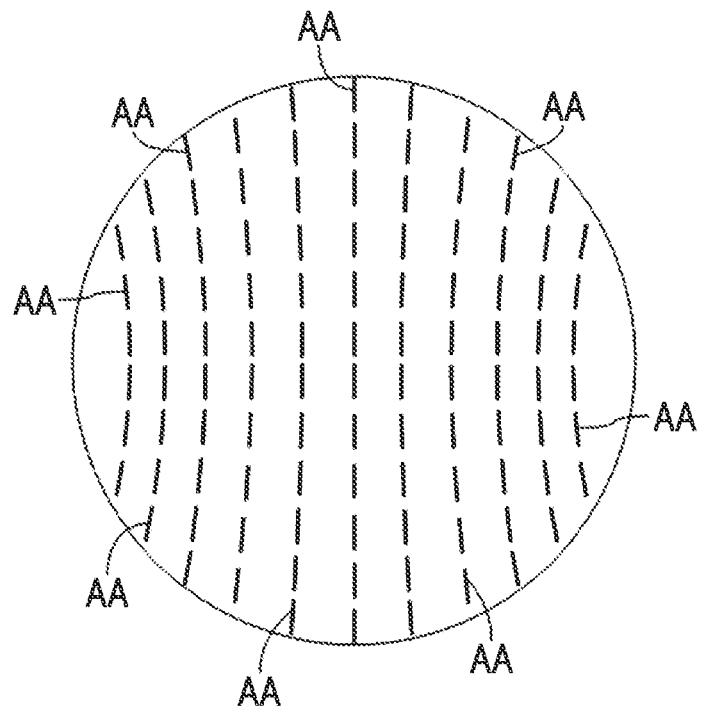
FIG. 3 is a schematic view illustrating a direction of an absorption axis of an absorbing polarizer A.

FIG. 3 illustrates an example of the alignment distribution of the absorption axes in the case where the polarizer A has a plurality of regions where directions of the absorption axes are different from each other. FIG. 3 is a schematic view illustrating distribution of orthographic projection of the local absorption axes of the polarizer A onto the plane (polarizer B). Further, in FIG. 3, each "AA" denotes a direction of orthographic projection of an absorption axis. As illustrated in FIG. 3, in a case where the polarizer A has a plurality of regions where the directions AA of orthographic projection of the absorption axes are different from each other, it is clarified that the polarizer A has a plurality of regions where directions of absorption axes are different from each other.

As described above (in the section of the method of specifying the position Z), the absorption axis in the polarizer A can be measured using AxoScan OPMF-1.

The polarizer A having the absorption axes aligned as described above can be formed, for example, by the method described in the section <<Method of forming light absorption anisotropic layer>> below.

Further, the absorption axis in the polarizer A is not limited to the above-described aspect as long as the position Z satisfying the specific requirements is present. For example, the position Z satisfying the specific requirements may be present by combining the polarizer A where all absorption axes are parallel to each other and the polarizer B having a plurality of regions where the absorption axes are different from each other.

<<Resin Base Material>>

The polarizer A may contain a resin base material. In a case where the polarizer A is molded into a curved surface shape, it is preferable that the resin base material has a tan δ peak temperature of 170° C. or lower. Further, from the viewpoint of enabling molding at a lower temperature, the tan δ peak temperature is preferably 150° C. or lower and more preferably 130° C. or lower.

Here, a method of measuring tan δ will be described. The loss modulus E" and the storage modulus E' of a film sample that has been humidity-adjusted in advance in an atmosphere of a temperature of 25° C. and a relative humidity of 60% RH for 2 hours or longer are measured under the following conditions using a dynamic viscoelasticity measuring device (DVA-200, manufactured by IT Measurement & Control Co., Ltd.), and the values are used to acquire tan δ(=E"/E').

Device: DVA-200, manufactured by IT Measurement & Control Co., Ltd.
Sample: 5 mm, length of 50 mm (gap of 20 mm)
Measurement conditions: tension mode
Measurement temperature: −150° C. to 220° C.
Heating conditions: 5° C./min
Frequency: 1 Hz In optical applications, a resin base material subjected to a stretching treatment is frequently used, and the stretching treatment frequently increases the tan δ peak temperature. For example, with a TAC (triacetyl cellulose) base material (TG40, manufactured by FUJIFILM Corporation), the tan δ peak temperature is 180° C. or higher.

The resin base material is not particularly limited, and a base material consisting of various optical resins can be used, and a resin base material having a tan δ peak temperature of 170° C. or lower is preferable. Examples of the resin constituting such a resin base material include polyolefin such as polyethylene, polypropylene, or a norbornene-based polymer; a cyclic olefin-based resin; polyvinyl alcohol; polyethylene terephthalate; an acrylic resin such as polymethacrylic acid ester or polyacrylic acid ester; polyethylene naphthalate; polycarbonate; polysulfone; polyethersulfone; polyetherketone; and polyphenylene sulfide, and polyphenylene oxide. Among these, from the viewpoints of readily available on the market and excellent transparency, a cyclic olefin-based resin, polyethylene terephthalate, or an acrylic resin is preferable, and a cyclic olefin-based resin or polymethacrylic acid ester is more preferable.

Examples of commercially available resin base materials include TECHNOLLOY S001G, TECHNOLLOY S014G, TECHNOLLOY S000, TECHNOLLOY C001, and TECHNOLLOY C000 (manufactured by Sumika Acryl Co., Ltd.), LUMIRROR U type, LUMIRROR FX10, and LUMIRROR SF20 (Toray Industries, Inc.), HK-53A (Higashiyama Film Co., Ltd.), TEFLEX FT3 (TOYOBO CO., LTD.), ESCENA and SCA40 (Sekisui Chemical Co., Ltd.), a ZEONOR Film (ZEON CORPORATION), and an Arton Film (JSR Corporation).

The thickness of the resin base material is not particularly limited, but is preferably in a range of 5 to 300 µm, more preferably in a range of 5 to 100 µm, and still more preferably in a range of 5 to 30 µm.

<<Light Absorption Anisotropic Layer>>

As described above, it is preferable that the light absorption anisotropic layer contains a liquid crystal compound and a dichroic substance.

Such a light absorption anisotropic layer can be formed using a composition containing a liquid crystal compound and a dichroic substance (hereinafter, also referred to as "composition for forming a light absorption anisotropic layer").

From the viewpoint of suppressing a decrease in the degree of polarization during heating, it is preferable that the liquid crystal compound and/or the dichroic substance contained in the composition for forming a light absorption anisotropic layer contains a radically polymerizable group. The molar content of the radically polymerizable group is preferably 0.6 mmol/g or greater, more preferably 1.0 mmol/g or greater, and still more preferably 1.5 mmol/g or greater with respect to the solid weight of the composition for forming a light absorption anisotropic layer. The upper limit is not particularly limited, but is preferably 5 mmol/g or less.

<Liquid Crystal Compound>

The composition for forming a light absorption anisotropic layer contains a liquid crystal compound.

Further, a liquid crystal compound that does not exhibit dichroic properties in a visible region is preferable as the liquid crystal compound.

As such a liquid crystal compound, both a low-molecular-weight liquid crystal compound and a polymer liquid crystal compound can be used. Here, the "low-molecular-weight liquid crystal compound" indicates a liquid crystal compound having no repeating units in the chemical structure. Here, the "polymer liquid crystal compound" is a liquid crystal compound having a repeating unit in the chemical structure.

Examples of the low-molecular-weight liquid crystal compound include liquid crystal compounds described in paragraphs [0027] to [0034] of JP2013-228706A. Among these, a low-molecular-weight liquid crystal compound exhibiting smectic properties is preferable.

Examples of the polymer liquid crystal compound include thermotropic liquid crystal polymers described in JP2011-237513A. Further, it is preferable that the polymer liquid crystal compound contains a crosslinkable group (such as an acryloyl group or a methacryloyl group) at a terminal.

The liquid crystal compound may be used alone or in combination of two or more kinds thereof. It is also preferable that the polymer liquid crystal compound and the low-molecular-weight liquid crystal compound are used in combination.

The content of the liquid crystal compound is preferably in a range of 25 to 2000 parts by mass, more preferably in a range of 33 to 1000 parts by mass, and still more preferably in a range of 50 to 500 parts by mass with respect to 100 parts by mass of the content of the dichroic substance in the composition for forming a light absorption anisotropic layer. In a case where the content of the liquid crystal compound is in the above-described range, the alignment degree of the polarizer is further improved.

From the viewpoint of further increasing the alignment degree of the light absorption anisotropic layer to be obtained, it is preferable that the liquid crystal compound is a polymer liquid crystal compound and more preferable that the liquid crystal compound is a polymer liquid crystal compound having a repeating unit represented by Formula (1) (hereinafter, also referred to as "repeating unit (1)").

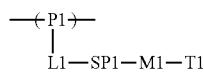

(1)

In Formula (1), P1 represents the main chain of the repeating unit, L1 represents a single bond or a divalent linking group, SP1 represents a spacer group, M1 represents a mesogen group, and T1 represents a terminal group.

Examples of the main chain of the repeating unit represented by P1 include groups represented by Formulae (P1-A) to (P1-D). Among these, from the viewpoints of diversity and ease of handling of a monomer serving as a raw material, a group represented by Formula (P1-A) is preferable.

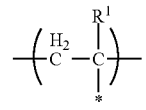

(P1-A)

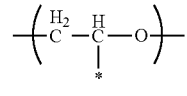

(P1-B)

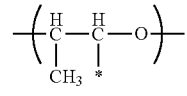

(P1-C)

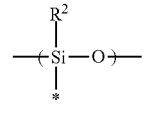

(P1-D)

In Formulae (P1-A) to (P1-D), "*" represents a bonding position with respect to L1 in Formula (1). In Formula (P1-A), $R^1$ represents a hydrogen atom or a methyl group. In Formula (P1-D), $R^2$ represents an alkyl group.

From the viewpoint of further increasing the alignment degree of the light absorption anisotropic layer to be obtained, it is preferable that the group represented by Formula (P1-A) is a unit of a partial structure of poly(meth)acrylic acid ester obtained by polymerizing (meth)acrylic acid ester.

From the viewpoint of further increasing the alignment degree of the light absorption anisotropic layer to be obtained, it is preferable that the group represented by Formula (P1-B) is an ethylene glycol unit in polyethylene glycol obtained by polymerizing ethylene glycol.

From the viewpoint of further increasing the alignment degree of the light absorption anisotropic layer to be obtained, it is preferable that the group represented by Formula (P1-C) is a propylene glycol unit obtained by polymerizing propylene glycol.

From the viewpoint of further increasing the alignment degree of the light absorption anisotropic layer to be obtained, it is preferable that the group represented by Formula (P1 -D) is a siloxane unit of polysiloxane obtained by polycondensation of silanol.

$L^1$ represents a single bond or a divalent linking group.

Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formulae, $R^3$ and $R^4$ each independently represent a hydrogen atom or an alkyl group having 1 to 6 carbon atoms which may have a substituent.

In a case where P1 represents a group represented by Formula (P1-A), from the viewpoint of further increasing the alignment degree of the light absorption anisotropic layer to be obtained, it is preferable that L1 represents a group represented by —C(O)O—.

In a case where P1 represents a group represented by any of Formulae (P1-B) to (P1-D), from the viewpoint of further increasing the alignment degree of the light absorption anisotropic layer to be obtained, it is preferable that L1 represents a single bond.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—$(CH_2—CH_2O)_{n1}$—* is preferable. In the formula, n1 represents an integer of 1 to 20, and "*" represents a bonding position with respect to L1 or M1 in Formula (1). From the viewpoint of further increasing the alignment degree of the light absorption anisotropic layer to be obtained, n1 represents preferably an integer of 2 to 10, more preferably an integer of 2 to 4, and most preferably 3.

Further, from the viewpoint of further increasing the alignment degree of the light absorption anisotropic layer to be obtained, a group represented by *—$(CH(CH_3)—CH_2O)_{n2}$—* is preferable as the oxypropylene structure represented by SP1. In the formula, n2 represents an integer of 1 to 3, and "*" represents a bonding position with respect to L1 or M1.

Further, from the viewpoint of further increasing the alignment degree of the light absorption anisotropic layer to be obtained, a group represented by *—$(Si(CH_3)_2—O)_{n3}$—* is preferable as the polysiloxane structure represented by SP1. In the formula, n3 represents an integer of 6 to 10, and "*" represents a bonding position with respect to L1 or M1.

Further, from the viewpoint of further increasing the alignment degree of the light absorption anisotropic layer to be obtained, a group represented by *—$(CF_2—CF_2)_{n4}$—* is preferable as the alkylene fluoride structure represented by SP1. In the formula, n4 represents an integer of 6 to 10, and "*" represents a bonding position with respect to L1 or M1.

The mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and, for example, particularly the description on pages 7 to 16 of "FlussigeKristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystals Handbook Editing Committee can be referred to.

As the mesogen group, for example, a group having at least one cyclic structure selected from the group consisting of an aromatic hydrocarbon group, a heterocyclic group, and an alicyclic group is preferable.

From the viewpoint of further increasing the alignment degree of the light absorption anisotropic layer to be obtained, the mesogen group contains preferably an aromatic hydrocarbon group, more preferably two to four aromatic hydrocarbon groups, and still more preferably three aromatic hydrocarbon groups.

From the viewpoints of exhibiting the liquid crystallinity, adjusting the liquid crystal phase transition temperature, and the availability of raw materials and synthetic suitability and from the viewpoint that the effects of the present invention are more excellent, as the mesogen group, a group represented by Formula (M1-A) or Formula (M1-B) is preferable, and a group represented by Formula (M1-B) is more preferable.

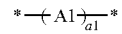

(M1-A)

(M1-B)

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent.

It is preferable that the divalent group represented by A1 is a 4- to 6-membered ring. Further, the divalent group represented by A1 may be a monocycle or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the alignment degree.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint of further increasing the alignment degree of the light absorption anisotropic layer to be obtained, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint of further increasing the alignment degree of the light absorption anisotropic layer to be obtained, it is preferable that one of the two LA1's represents a divalent linking group and the other represents a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (here, Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among these, from the viewpoint of further increasing the alignment degree of the light absorption anisotropic layer to be obtained, —C(O)O— is preferable. LA1 may represent a group obtained by combining two or more of these groups.

Specific examples of M1 include the following structures. In the following specific examples, "Ac" represents an acetyl group.

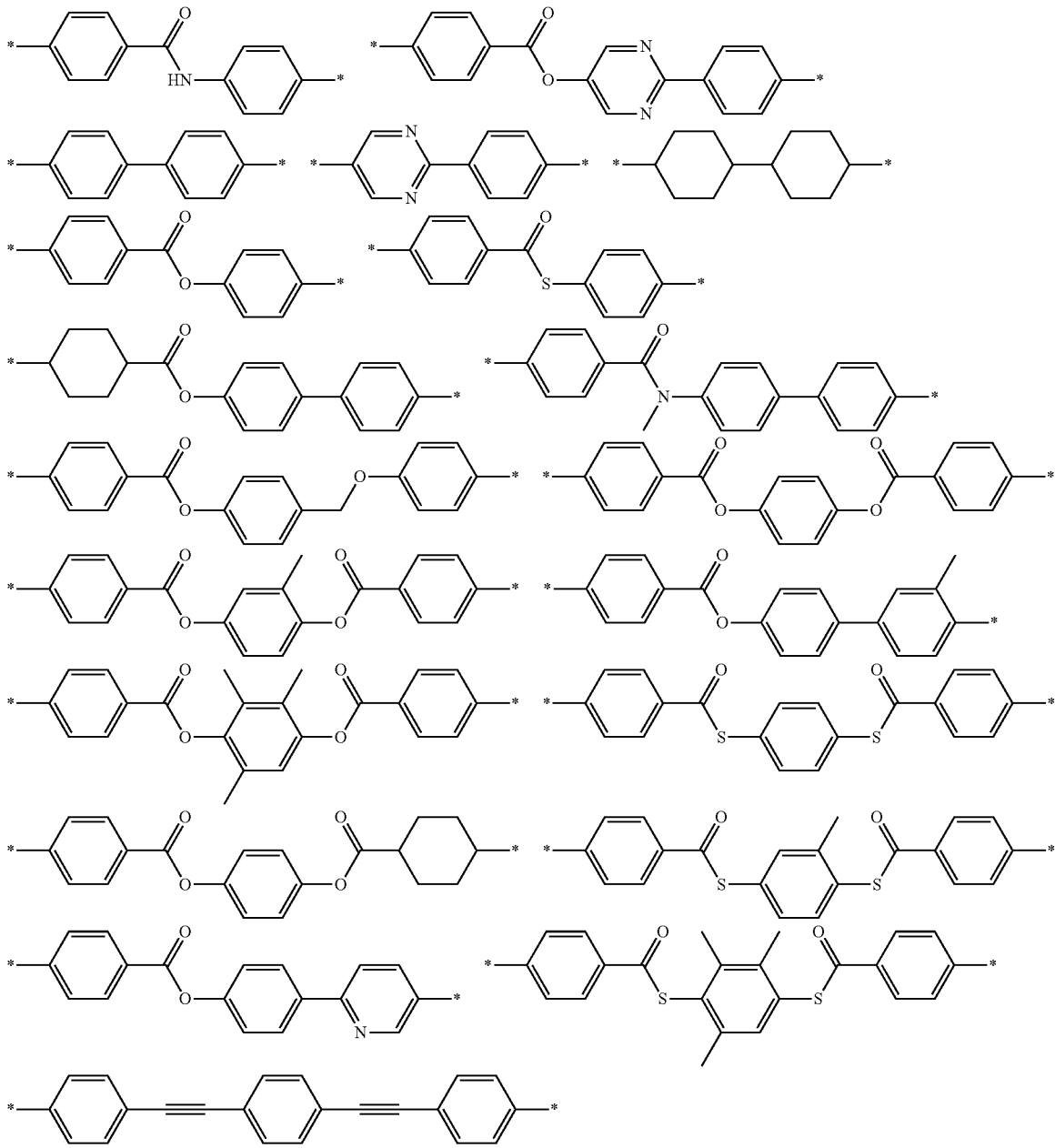

-continued
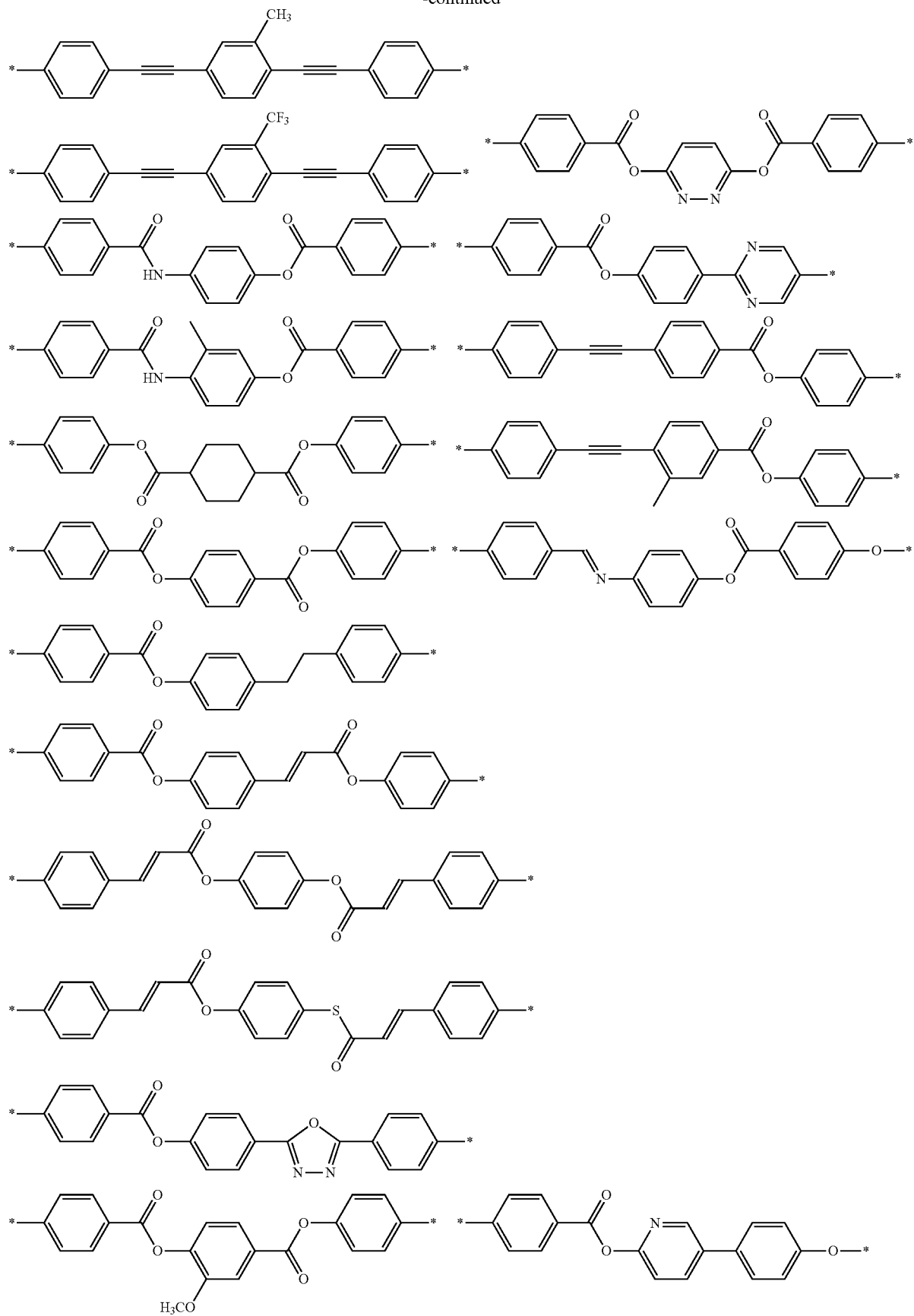

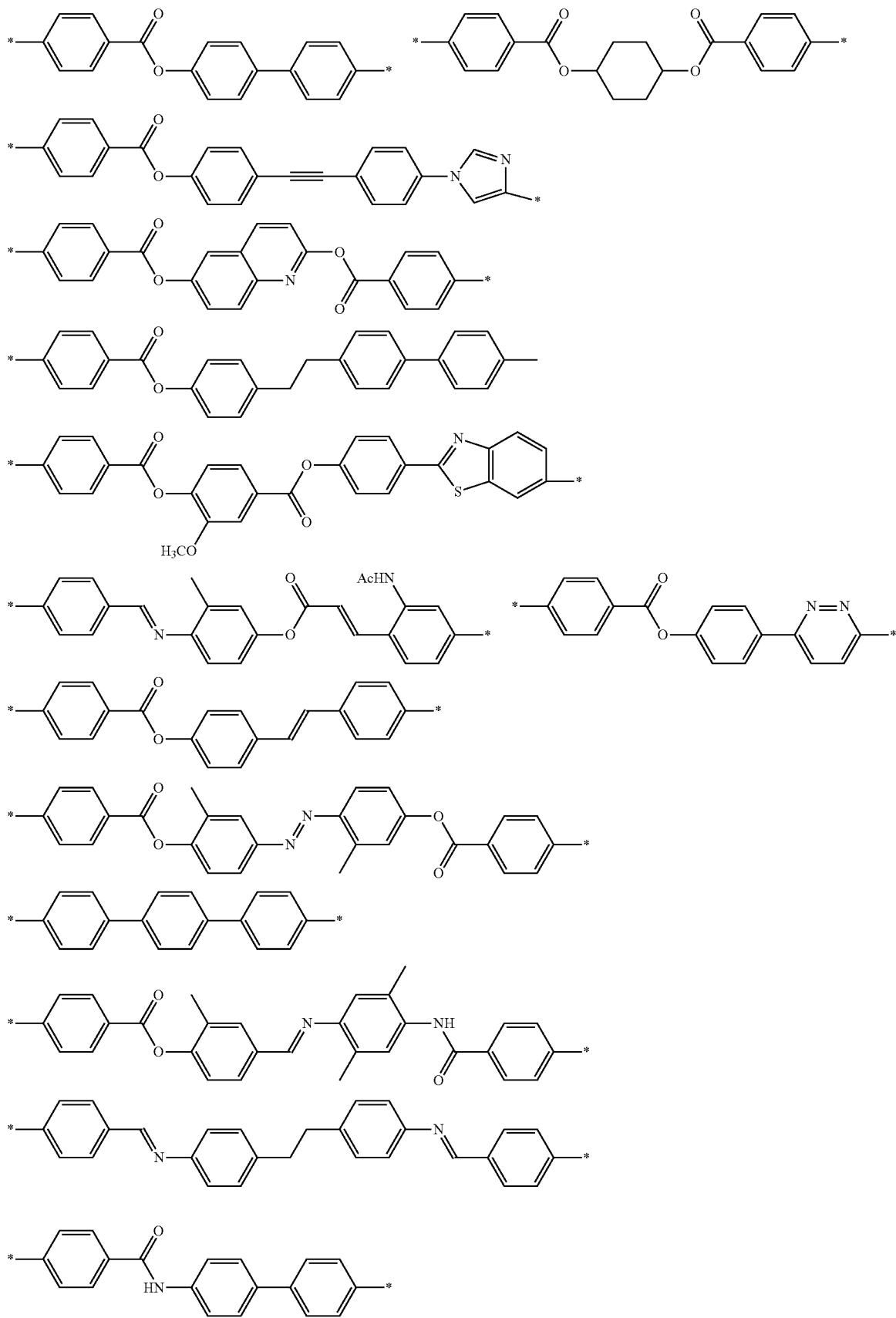

-continued
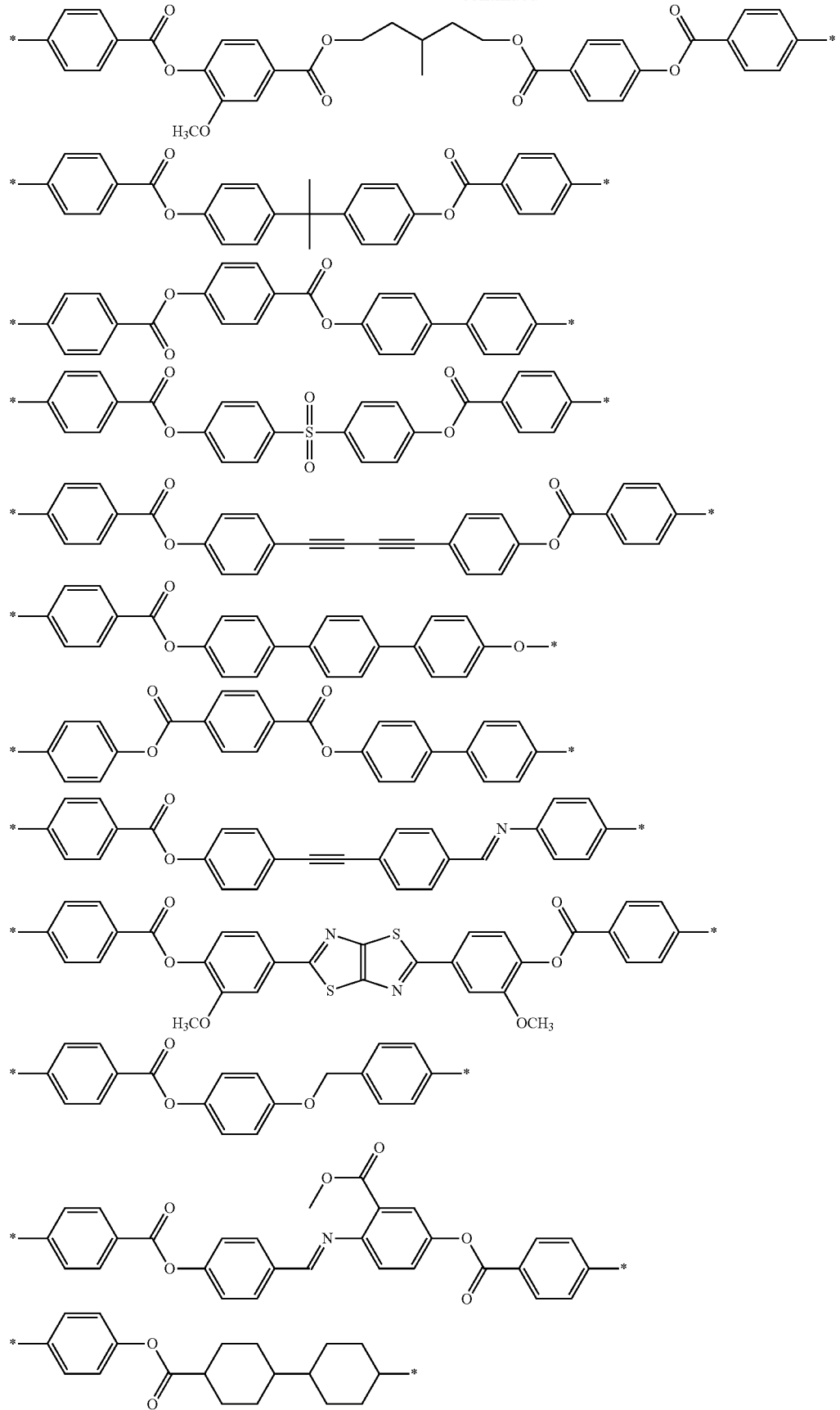

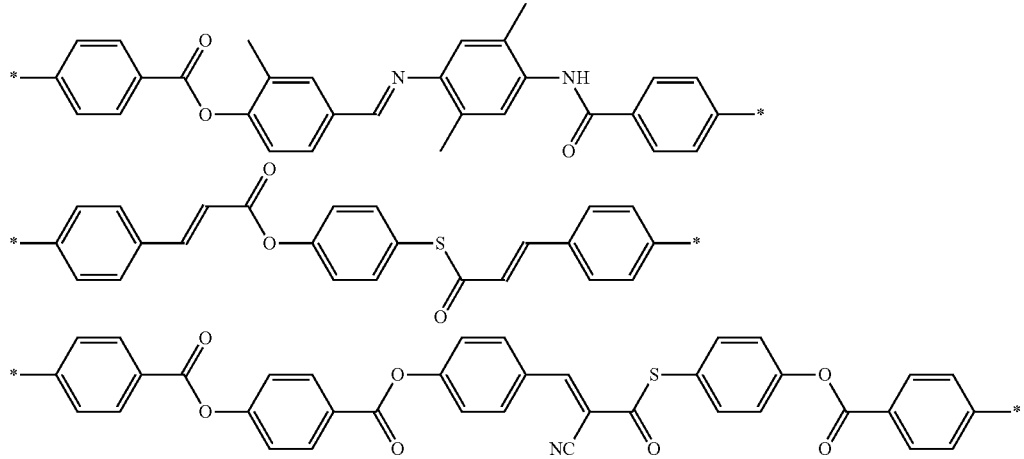

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group, specific examples of the linking group are the same as those for L1 and SP1 described above, and A represents a (meth)acryloyloxy group).

From the viewpoint of further increasing the alignment degree of the light absorption anisotropic layer to be obtained, T1 represents preferably an alkoxy group having 1 to 10 carbon atoms, more preferably an alkoxy group having 1 to 5 carbon atoms, and still more preferably a methoxy group. These terminal groups may be further substituted with these groups or the polymerizable groups described in JP2010-244038A.

From the viewpoint of further increasing the alignment degree of the light absorption anisotropic layer to be obtained, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the alignment degree of the polarizer is further improved. Here, the "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

From the viewpoint of further increasing the alignment degree of the light absorption anisotropic layer to be obtained, the content of the repeating unit (1) is preferably in a range of 20% to 100% by mass with respect to 100% by mass of all the repeating units of the polymer liquid crystal compound.

In the present specification, the content of each repeating unit contained in the polymer liquid crystal compound is calculated based on the charged amount (mass) of each monomer used for obtaining each repeating unit.

The polymer liquid crystal compound may have only one or two or more kinds of the repeating units (1). Among the repeating units, from the viewpoint of further increasing the alignment degree of the light absorption anisotropic layer to be obtained, it is preferable that the polymer liquid crystal compound has two kinds of the repeating units (1).

In a case where the polymer liquid crystal compound has two kinds of the repeating units (1), from the viewpoint of further increasing the alignment degree of the light absorption anisotropic layer to be obtained, it is preferable that the terminal group represented by T1 in one unit (repeating unit A) is an alkoxy group and the terminal group represented by T1 in the other unit (repeating unit B) is a group other than the alkoxy group.

From the viewpoint of further increasing the alignment degree of the light absorption anisotropic layer to be obtained, as the terminal group represented by T1 in the repeating unit B, an alkoxycarbonyl group, a cyano group, or a (meth)acryloyloxy group-containing group is preferable, and an alkoxycarbonyl group or a cyano group is more preferable.

From the viewpoint of further increasing the alignment degree of the light absorption anisotropic layer to be obtained, the ratio (AB) of the content of the repeating unit A in the polymer liquid crystal compound to the content of the repeating unit B in the polymer liquid crystal compound is preferably in a range of 50/50 to 95/5, more preferably in a range of 60/40 to 93/7, and still more preferably in a range of 70/30 to 90/10.

(Repeating Unit (3-2))

The polymer liquid crystal compound may further have a repeating unit represented by Formula (3-2) (in the present specification, also referred to as "repeating unit (3-2)"). This provides advantages such as improvement of the solubility of the polymer liquid crystal compound in a solvent and ease of adjustment of the liquid crystal phase transition temperature.

The repeating unit (3-2) is different from the repeating unit (1) in terms that the repeating unit (3-2) does not have at least a mesogen group.

In a case where the polymer liquid crystal compound has the repeating unit (3-2), the polymer liquid crystal compound may be a copolymer of the repeating unit (1) and the repeating unit (3-2) or a copolymer of the repeating unit (1), the repeating unit (3-2), and the repeating units A and B. The copolymer may be any polymer such as a block polymer, an alternating polymer, a random polymer, or a graft polymer.

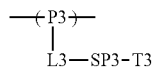
(3-2)

In Formula (3-2), P3 represents the main chain of the repeating unit, L3 represents a single bond or a divalent linking group, SP3 represents a spacer group, and T3 represents a terminal group.

Specific examples of P3, L3, SP3, and T3 in Formula (3-2) are the same as those for P1, L1, SP1, and T1 in Formula (1).

Here, from the viewpoint of improving the strength of the light absorption anisotropic layer, it is preferable that T3 in Formula (3-2) contains a polymerizable group.

The content of the repeating unit (3-2) is preferably in a range of 0.5% to 40% by mass and more preferably in a range of 1% to 30% by mass with respect to 100% by mass of all the repeating units of the polymer liquid crystal compound.

The polymer liquid crystal compound may have only one or two or more kinds of repeating units (3-2). In a case where the polymer liquid crystal compound has two or more kinds of repeating units (3-2), it is preferable that the total amount thereof is in the above-described ranges.

(Weight-Average Molecular Weight)

From the viewpoint of further increasing the alignment degree of the light absorption anisotropic layer to be obtained, the weight-average molecular weight (Mw) of the polymer liquid crystal compound is preferably in a range of 1000 to 500000 and more preferably in a range of 2000 to 300000. In a case where the Mw of the polymer liquid crystal compound is in the above-described range, the polymer liquid crystal compound is easily handled.

In particular, from the viewpoint of suppressing cracking during the coating, the weight-average molecular weight (Mw) of the polymer liquid crystal compound is preferably 10000 or greater and more preferably in a range of 10000 to 300000.

In addition, from the viewpoint of the temperature latitude of the alignment degree, the weight-average molecular weight (Mw) of the polymer liquid crystal compound is preferably less than 10000 and preferably 2000 or greater and less than 10000.

Here, the weight-average molecular weight and the number average molecular weight in the present specification are values measured by gel permeation chromatography (GPC).
Solvent (eluent): N-methylpyrrolidone
Equipment name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2800000 to 1050 (Mw/Mn=1.03 to 1.06) are used. (Content)

The content of the liquid crystal compound is preferably in a range of 50% to 99% by mass and more preferably in a range of 70% to 96% by mass with respect to the solid content of the composition for forming a light absorption anisotropic layer.

Here, "solid content in the composition for forming a light absorption anisotropic layer" denotes components excluding solvents. Specific examples of the solid content include the above-described liquid crystal compounds, and the following dichroic substances, polymerization initiators, and surfactants.

<Dichroic Substance>

The composition for forming a light absorption anisotropic layer contains a dichroic substance.

The dichroic substance is not particularly limited, and known dichroic substances (dichroic coloring agents) can be used, and examples of such known dichroic substances include a visible light absorbing substance (dichroic coloring agent), a light emitting substance (such as a fluorescent substance or a phosphorescent substance), an ultraviolet absorbing substance, an infrared absorbing substance, a non-linear optical substance, a carbon nanotube, and an inorganic substance (for example, a quantum rod).

Specific examples of the dichroic substance include those described in paragraphs [0067] to [0071] of JP2013-228706A, paragraphs [008] to [0026] of JP2013-227532A, paragraphs [0008] to [0015] of JP2013-209367A, paragraphs [0045] to [0058] of JP2013-14883A, paragraphs [0012] to [0029] of JP2013-109090A, paragraphs [0009] to [0017] of JP2013-101328A, paragraphs [0051] to [0065] of JP2013-37353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, and paragraphs [0014] to [0034] of WO2018/164252A.

The light absorption anisotropic layer may contain two or more kinds of dichroic substances. For example, from the viewpoint of making the color of the liquid crystal layer closer to black, it is preferable that at least one dichroic substance having a maximal absorption wavelength in a wavelength range of 370 to 550 nm and at least one dichroic substance having a maximal absorption wavelength in a wavelength range of 500 to 700 nm are used in combination.

The dichroic substance contained in the composition for forming a light absorption anisotropic layer may contain a crosslinkable group. In particular, from the viewpoint of suppressing a change in the degree of polarization during heating, it is preferable that the dichroic substance contains a crosslinkable group.

Examples of the crosslinkable group include a (meth)acryloyl group, an epoxy group, an oxetanyl group, and a styryl group. Among these, a (meth)acryloyl group is preferable.

(Content)

From the viewpoint of further increasing the alignment degree of the dichroic substance, the content of the dichroic substance in the composition for forming a light absorption anisotropic layer is preferably in a range of 1 to 400 parts by mass, more preferably in a range of 2 to 100 parts by mass, and still more preferably in a range of 5 to 30 parts by mass with respect to 100 parts by mass of the liquid crystal compound.

<Surfactant>

The composition for forming a light absorption anisotropic layer may contain a surfactant.

As the surfactant contained in the composition for forming a light absorption anisotropic layer, a known surfactant can be used, but a copolymer having a repeating unit containing a fluorinated alkyl group (hereinafter, also referred to as "repeating unit F") and a repeating unit having a ring structure (hereinafter, also referred to as "repeating unit M") is preferable.

(Repeating Unit F)

It is preferable that the repeating unit F contained in the copolymer is a repeating unit represented by Formula (a).

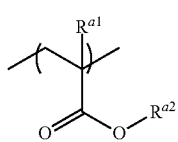

In Formula (a), $R^{a1}$ represents a hydrogen atom or an alkyl group having 1 to 20 carbon atoms, $R^{a2}$ represents an alkyl group having 1 to 20 carbon atoms or an alkenyl group having 2 to 20 carbon atoms, in which at least one carbon atom has a fluorine atom as a substituent.

In Formula (a), from the viewpoint of further suppressing alignment defects of the light absorption anisotropic layer to be obtained, $R^{a2}$ represents preferably an alkyl group having 1 to 10 carbon atoms or an alkenylene group having 2 to 10 carbon atoms, in which at least one carbon atom has a fluorine atom as a substituent, more preferably an alkyl group having 1 to 10 carbon atoms, and still more preferably a group in which half or more of the carbon atoms contained in $R^{a2}$ have a fluorine atom as a substituent.

It is more preferable that the repeating unit F contained in the copolymer is a repeating unit represented by Formula (b).

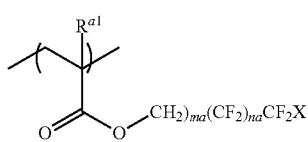

In Formula (b), $R^{a1}$ represents a hydrogen atom or an alkyl group having 1 to 20 carbon atoms, ma and na each independently represent an integer of 0 or greater, and X represents a hydrogen atom or a fluorine atom.

Here, it is preferable that ma represents preferably an integer of 1 or greater and 10 or less and na represents 4 or greater and 12 or less.

Examples of the monomer forming the repeating unit F (hereinafter, also referred to as a "fluoroalkyl group-containing monomer") of the copolymer include 2,2,2-trifluoroethyl (meth)acrylate, 2,2,3,3,3-pentafluoropropyl (meth)acrylate, 2-(perfluorobutyl)ethyl (meth)acrylate, 2-(perfluorohexyl)ethyl (meth)acrylate, 2-(perfluorooctyl)ethyl (meth)acrylate, 2-(perfluorodecyl)ethyl (meth)acrylate, 2-(perfluoro-3-methylbutyl)ethyl (meth)acrylate, 2-(perfluoro-5-methylhexyl)ethyl (meth)acrylate, 2-(perfluoro-7-methyloctyl)ethyl (meth)acrylate, 1H,1H,3H-tetrafluoropropyl (meth)acrylate, 1H,1H,5H-octafluoropentyl (meth)acrylate, 1H,1H,7H-dodecafluoroheptyl (meth)acrylate, 1H,1H,9H-hexadecafluorononyl (meth)acrylate, 1H-1-(trifluoromethyl) trifluoroethyl (meth)acrylate, 1H,1H,3H-hexafluorobutyl (meth)acrylate, 3-perfluorobutyl-2-hydroxypropyl (meth)acrylate, 3-perfluorohexyl-2-hydroxypropyl (meth)acrylate, 3-perfluorooctyl-2-hydroxypropyl (meth)acrylate, 3-(perfluoro-3-methylbutyl)-2-hydroxypropyl (meth)acrylate, 3-(perfluoro-5-methylhexyl)-2-hydroxypropyl (meth)acrylate, and 3-(perfluoro-7-methyloctyl)-2-hydroxypropyl (meth)acrylate.

From the viewpoints of the reactivity and the surface modification effect, the ratio of copolymerizing the fluoroalkyl group-containing monomer is preferably in a range of 0.01 to 100 mole, more preferably in a range of 0.1 to 50 mole, and still more preferably in a range of 1 to 30 mole with respect to 1 mole of the monomer containing a mesogen group described below.

(Repeating Unit M)

The repeating unit M contained in the copolymer may be a unit having a ring structure.

Examples of the ring structure include at least one ring structure selected from the group consisting of an aromatic hydrocarbon group, a heterocyclic group, and an alicyclic group. From the viewpoint of suppressing alignment defects, it is preferable that the repeating unit M has two or more ring structures.

It is more preferable that the repeating unit M contained in the copolymer is a repeating unit represented by Formula (b).

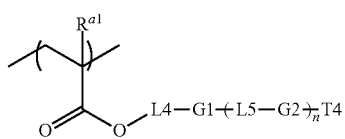

In Formula (c), Rat represents a hydrogen atom or an alkyl group having 1 to 20 carbon atoms, L4 and L5 each independently represent a single bond or an alkylene group having 1 to 8 carbon atoms, G1 and G2 each independently represent a divalent cyclic group, and T4 represents a terminal group. n represents an integer of 0 to 4. In a case where n represents an integer of 2 to 4, two or more L5's may be the same as or different from each other, and two or more G2's may be the same as or different from each other.

In regard to the alkylene group represented by L4 and L5, one or more —$CH_2$—'s constituting the alkylene group may be substituted with at least one group selected from the group consisting of a single bond, —O—, —S—, —$NR^{31}$—, —C(=O)—, —C(=S)—, —$CR^{32}$=$CR^{32}$—, —$SiR^{33}R^{34}$—, —N=N—, —$CR^{35}$=N—N=$CR^{36}$—, —$CR^{37}$=N—, and —$SO_2$—, and $R^{31}$ to $R^{37}$ each independently represent a hydrogen atom, a halogen atom, a cyano group, a nitro group, or a linear or branched alkyl group having 1 to 10 carbon atoms).

Further, in a case where L4 or L5 represents an alkylene group, the hydrogen atoms contained in one or more —CH$_2$—'s constituting the alkylene group may be substituted with at least one group selected from the group consisting of a halogen atom, a cyano group, a nitro group, a hydroxyl group, a linear alkyl group having 1 to 10 carbon atoms, and a branched alkyl group having 1 to 10 carbon atoms.

Among these, it is preferable that L4 represents an alkyleneoxy group having 4 to 6 carbon atoms and having a terminal which is oxygen and that L5 represents an ester group.

Each divalent cyclic group represented by G1 and G2 is independently a divalent alicyclic hydrocarbon group or a divalent aromatic hydrocarbon group having 5 to 8 carbon atoms, and one or more —CH$_2$— constituting the alicyclic hydrocarbon group may be substituted with —O—, —S—, or —NH—. Further, the divalent cyclic group may be a divalent group in which a plurality of groups selected from alicyclic hydrocarbon groups and aromatic hydrocarbon groups are bonded via a single bond. Among these, a benzene ring is preferable.

Examples of the terminal group represented by T4 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group having 1 to 10 carbon atoms), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Among these, a hydrogen atom or a cyano group is preferable.

The molar ratio of the repeating unit F to all the repeating units of the copolymer is preferably 50% by mole or greater from the viewpoint of the alignment degree and preferably 70% by mole or less from the viewpoint of cissing.

(Content)

From the viewpoint of further increasing the alignment degree of the light absorption anisotropic layer to be obtained, the content of the surfactant described above is preferably in a range of 0.05 to 15 parts by mass, more preferably in a range of 0.08 to 10 parts by mass, and still more preferably in a range of 0.1 to 5 parts by mass with respect to 100 parts by mass of the liquid crystal compound.

<Polymerization Initiator>

It is preferable that the composition for forming a light absorption anisotropic layer contains a polymerization initiator.

The polymerization initiator is not particularly limited, but a compound having photosensitivity, that is, a photopolymerization initiator is preferable.

As the photopolymerization initiator, various compounds can be used without any particular limitation. Specific examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), o-acyloxime compounds (paragraph [0065] of JP2016-027384A), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

A commercially available product can also be used as such a photopolymerization initiator. Examples of the commercially available product of the photopolymerization initiator include IRGACURE 184, IRGACURE 907, IRGACURE 369, IRGACURE 651, IRGACURE 819, IRGACURE OXE-01, and IRGACURE OXE-02 (manufactured by BASF SE).

In a case where the composition for forming a light absorption anisotropic layer contains a polymerization initiator, the content of the polymerization initiator is preferably in a range of 0.01 to 30 parts by mass and more preferably in a range of 0.1 to 15 parts by mass with respect to 100 parts by mass of the total amount of the dichroic substance and the polymer liquid crystal compound in the composition for forming a light absorption anisotropic layer. The durability of the light absorption anisotropic film is enhanced in a case where the content of the polymerization initiator is 0.01 parts by mass or greater, and the alignment degree of the light absorption anisotropic film is enhanced in a case where the content thereof is 30 parts by mass or less.

The polymerization initiator may be used alone or in combination of two or more kinds thereof. In a case where the composition contains two or more kinds of polymerization initiators, it is preferable that the total amount of the polymerization initiators is in the above-described ranges.

<Solvent>

From the viewpoints of the workability and the like, it is preferable that the composition for forming a light absorption anisotropic layer contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, 2-methyltetrahydrofuran, cyclopentyl methyl ether, tertrahydropyran, and dioxolanes), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane, dichloroethane, dichlorobenzene, and chlorotoluene), esters (such as methyl acetate, ethyl acetate, butyl acetate, and ethyl lactate), alcohols (such as ethanol, isopropanol, butanol, cyclohexanol, isopentyl alcohol, neopentyl alcohol, diacetone alcohol, and benzyl alcohol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, and N-ethylpyrrolidone), and heterocyclic compounds (such as pyridine), and water.

These solvents may be used alone or in combination of two or more kinds thereof.

Among these solvents, from the viewpoint of exhibiting the effect of the excellent solubility, ketones (particularly cyclopentanone and cyclohexanone), ethers (particularly tetrahydrofuran, cyclopentyl methyl ether, tetrahydropyran, and dioxolan), and amides (particularly dimethylformamide, dimethylacetamide, N-methylpyrrolidone, and N-ethylpyrrolidone) are preferable.

In a case where the composition for forming a light absorption anisotropic layer contains a solvent, the content of the solvent is preferably in a range of 80% to 99% by mass, more preferably in a range of 83% to 97% by mass, and particularly preferably in a range of 85% to 95% by mass with respect to the total mass of the composition for forming a light absorption anisotropic layer.

These solvents may be used alone or in combination of two or more kinds thereof. In a case where the composition contains two or more kinds of solvents, it is preferable that the total amount of the solvents is in the above-described range.

The thickness of the light absorption anisotropic layer is not particularly limited, but is preferably in a range of 100 to 8000 nm and more preferably in a range of 300 to 5000 nm from the viewpoint of reducing the thickness of the optical element.

<<Alignment Film>>

The polarizer A may further include an alignment film, and it is preferable that the polarizer A includes an alignment film from the viewpoint of the aligning properties of the ab sorption axis of the light ab sorption anisotropic layer.

The alignment film is not particularly limited as long as the film has an alignment function, but a photo-alignment film is preferable.

The photo-alignment film that the polarizer A may have is not particularly limited as long as the photo-alignment film is an alignment film in which an alignment function is exerted by irradiation with light, and a known photo-alignment film can be used.

The material for forming the photo-alignment film is not particularly limited, and examples thereof include a photo-alignment agent. The photo-alignment film is formed of, for example, a composition for forming a photo-alignment film containing a photo-alignment agent.

A photo-alignment agent is a compound containing a photo-aligned group. The compound containing a photo-aligned group may be a polymer having a repeating unit containing a photo-aligned group.

The photo-aligned group is a functional group capable of imparting anisotropy to a film by irradiation with light. More specifically, the photo-aligned group is a group in which a change in molecular structure of the group may occur by irradiation with light (for example, linearly polarized light). Typically, the photo-aligned group is a group in which at least one photoreaction selected from a photoisomerization reaction, a photodimerization reaction, or a photodecomposition reaction may be caused by irradiation with light (for example, linearly polarized light).

Among these photo-aligned groups, a group that causes a photoisomerization reaction (a group having a photoisomerization structure) or a group that causes a photodimerization reaction (a group having a photodimerization structure) is preferable, and a group that causes a photodimerization reaction is more preferable.

The photoisomerization reaction is a reaction that causes stereoisomerization or structural isomerization due to the action of light. Examples of known substances that cause such a photoisomerization reaction include substances having an azobenzene structure (K. Ichimura et al., Mol. Cryst. Liq. Cryst., 298, page 221 (1997)), substances having a hydrazono-$\beta$-ketoester structure (S. Yamamura et al., Liquid Crystals, vol. 13, No. 2, page 189 (1993)), substances having a stilbene structure (J. G. Victor and J. M. Torkelson, Macromolecules, 20, page 2241 (1987)), and groups having a cinnamic acid (cinnamoyl) structure (skeleton) and substances having a spiropyran structure (K. Ichimura et al., Chemistry Letters, page 1063 (1992); K. Ichimura et al., Thin Solid Films, vol. 235, page 101 (1993)).

As the group that causes the photoisomerization reaction, a group that causes the photoisomerization reaction which has a C=C bond or a N=N bond is preferable, and examples of such a group include a group having an azobenzene structure (skeleton), a group having a hydrazono-$\beta$-ketoester structure (skeleton), a group having a stilbene structure (skeleton), a group having a cinnamic acid (cinnamoyl) structure (skeleton), and a group having a spiropyran structure (skeleton). Among these groups, a group having a cinnamoyl structure or a group having a coumarin structure is preferable, and a group having a cinnamoyl structure is more preferable.

The photodimerization reaction is a reaction in which a ring structure is typically formed by occurrence of an addition reaction between two groups due to the action of light. Examples of known substances that cause such photodimerization include substances having a cinnamic acid structure (M. Schadt et al., J. Appl. Phys., vol. 31, No. 7, page 2155 (1992)), substances having a coumarin structure (M. Schadt et al., Nature., vol. 381, page 212 (1996)), substances having a chalcone structure (Toshihiro Ogawa et al., Preprints of symposium on liquid crystals, 2AB03 (1997)), and substances having a benzophenone structure (Y. K. Jang et al., SID Int. Symposium Digest, P-53 (1997)).

Examples of the group that causes the photodimerization reaction include a group having a cinnamic acid (cinnamoyl) structure (skeleton), a group having a coumarin structure (skeleton), a group having a chalcone structure (skeleton), a group having a benzophenone structure (skeleton), and a group having an anthracene structure (skeleton). Among these groups, a group having a cinnamoyl structure or a group having a coumarin structure is preferable, and a group having a cinnamoyl structure is more preferable.

Further, it is preferable that the compound containing a photo-aligned group further contains a crosslinkable group.

As the crosslinkable group, a thermally crosslinkable group that causes a curing reaction due to the action of heat and a photocrosslinkable group that causes a curing reaction due to the action of light are preferable, and the crosslinkable group may be a crosslinkable group that contains both a thermally crosslinkable group and a photocrosslinkable group.

Examples of the crosslinkable group include at least one selected from the group consisting of an epoxy group, an oxetanyl group, a group represented by —NH—CH$_2$—O—R (R represents a hydrogen atom or an alkyl group having 1 to 20 carbon atoms), a radically polymerizable group (group having an ethylenically unsaturated double bond), and a block isocyanate group. Among these, an epoxy group, an oxetanyl group, or a group having an ethylenically unsaturated double bond is preferable.

Further, a 3-membered cyclic ether group is also referred to as an epoxy group, and a 4-membered cyclic ether group is also referred to as an oxetanyl group.

Further, examples of the radically polymerizable group (group having an ethylenically unsaturated double bond) include a vinyl group, an allyl group, a styryl group, acryloyl group, and a methacryloyl group. Among these, an acryloyl group or a methacryloyl group is preferable.

As one of preferred embodiments of the photo-alignment film, a photo-alignment film formed of a composition for forming a photo-alignment film containing a polymer A that has a repeating unit a1 containing a cinnamate group may be exemplified.

Here, in the present specification, the cinnamate group is a group having a cinnamic acid structure containing cinnamic acid or a derivative thereof as a basic skeleton and is a group represented by Formula (I) or Formula (II).

(I)

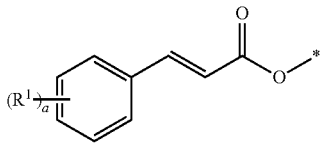

(II)

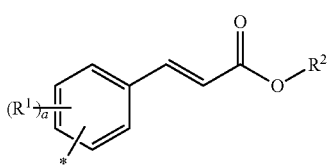

In the formulae, $R^1$ represents a hydrogen atom or a monovalent organic group, and $R^2$ represents a monovalent organic group. Further, a represents an integer of 0 to 5 in Formula (I), and a represents 0 to 4 in Formula (II). In a case where a represents 2 or greater, a plurality of $R^1$'s may be the same as or different from each other. "*" represents a bonding site.

The polymer A is not particularly limited as long as the polymer has a repeating unit a1 containing a cinnamate group, and a known polymer of the related art can be used.

The weight-average molecular weight of the polymer A is preferably in a range of 1000 to 500000, more preferably in a range of 2000 to 300000, and still more preferably in a range of 3000 to 200000.

Here, the weight-average molecular weight is defined as a value in terms of polystyrene (PS) which is measured by gel permeation chromatography (GPC), and the measurement according to GPC in the present invention can be performed using TSKgel Super HZM-H, HZ4000, and HZ2000 as columns with HLC-8220 GPC (manufactured by Tosoh Corporation).

Examples of the repeating unit a1 containing a cinnamate group contained in the polymer A include repeating units represented by Formulae (A1) to (A4).

(A1)

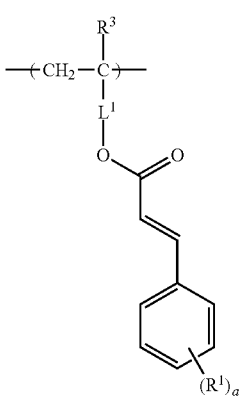

(A2)

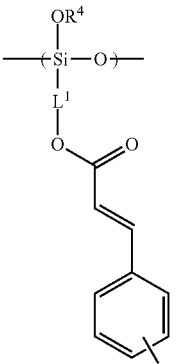

(A3)

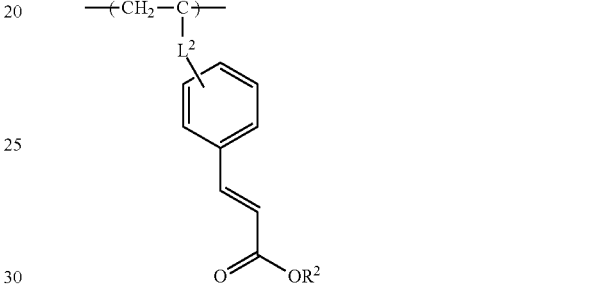

(A4)

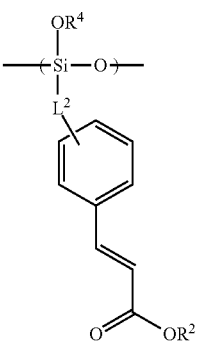

Here, $R^3$ represents a hydrogen atom or a methyl group in Formulae (A1) and (A3), and $R^4$ represents an alkyl group having 1 to 6 carbon atoms in Formulae (A2) and (A4).

In Formulae (A1) and (A2), $L^1$ represents a single bond or a divalent linking group, a represents an integer of 0 to 5, and $R^1$ represents a hydrogen atom or a monovalent organic group.

In Formulae (A3) and (A4), $L^2$ represents a divalent linking group, and $R^2$ represents a monovalent organic group.

Further, $L^1$ represents, for example, —CO—O—Ph—, —CO—O—Ph—Ph—, —CO—O—$(CH_2)_n$—, —CO—O—$(CH_2)_n$—Cy—, or —$(CH_2)_n$—Cy—. Here, Ph represents a divalent benzene ring which may have a substituent (for example, a phenylene group), Cy represents a divalent cyclohexane ring which may have a substituent (for example, a cyclohexane-1,4-diyl group), and n represents an integer of 1 to 4.

Further, $L^2$ represents, for example, —O—CO— or —O—CO—$(CH_2)_m$—O—. Here, m represents an integer of 1 to 6.

Further, examples of the monovalent organic group as $R^1$ include a chain or cyclic alkyl group having 1 to 20 carbon atoms, an alkoxy group having 1 to 20 carbon atoms, and an aryl group having 6 to 20 carbon atoms which may have a substituent.

Further, examples of the monovalent organic group as $R^2$ include a chain or cyclic alkyl group having 1 to 20 carbon atoms and an aryl group having 6 to 20 carbon atoms which may have a substituent.

Further, it is preferable that a represents 1 and $R^1$ is positioned at the para position.

Further, examples of the substituent that the above-described Ph, Cy, and aryl group may have an alkyl group, an alkoxy group, a hydroxy group, a carboxy group, and an amino group.

From the viewpoint of further improving the aligning properties of the light absorption anisotropic layer and further improving the adhesiveness of the light absorption anisotropic layer, it is preferable that the polymer A further has a repeating unit a2 containing a crosslinkable group.

The definition and preferred embodiments of the crosslinkable group are as described above.

Among the examples, the repeating unit that contains an epoxy group, an oxetanyl group, and a group having an ethylenically unsaturated double bond is preferable as the repeating unit a2 containing a crosslinkable group.

Specific preferred examples of the repeating unit that contains an epoxy group, an oxetanyl group, and a group having an ethylenically unsaturated double bond include the following repeating units. Further, $R^3$ and $R^4$ each have the same definition as that for $R^3$ and $R^4$ in Formulas (A1) and (A2).

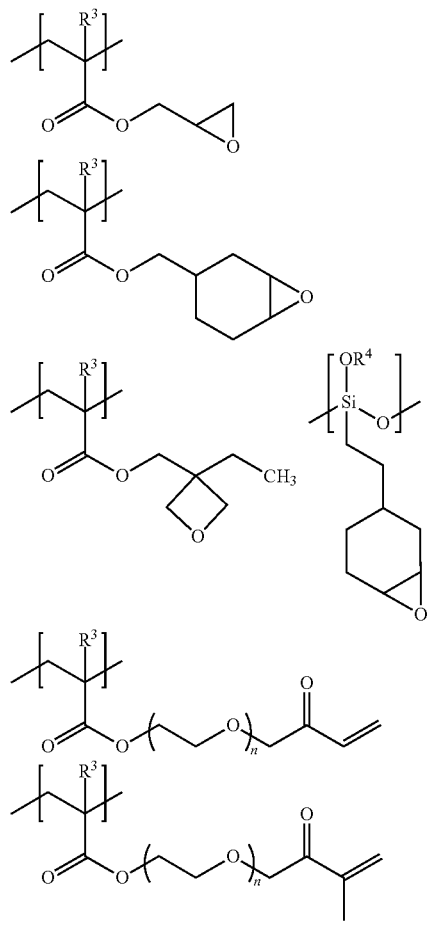

The polymer A may have repeating units other than the repeating unit a1 and the repeating unit a2 described above.

Examples of the monomer forming other repeating units include an acrylic acid ester compound, a methacrylic acid ester compound, a maleimide compound, an acrylamide compound, acrylonitrile, a maleic acid anhydride, a styrene compound, and a vinyl compound.

In a case where the composition for forming a photo-alignment film contains an organic solvent described below, the content of the polymer A is preferably in a range of 0.1 to 50 parts by mass and more preferably in a range of 0.5 to 10 parts by mass with respect to 100 parts by mass of the organic solvent.

From the viewpoint of the workability for preparing a photo-alignment film, it is preferable that the composition for forming a photo-alignment film contains a solvent. Examples of the solvent include water and an organic solvent. Examples of the organic solvent include an organic solvent that the composition for forming a light absorption anisotropic layer may contain.

These solvents may be used alone or in combination of two or more kinds thereof.

The composition for forming a photo-alignment film may contain other components in addition to the above-described components. Examples of the other components include an acid generator, a crosslinking catalyst, an adhesion improver, a leveling agent, a surfactant, and a plasticizer.

A method for forming a photo-alignment film formed of the composition for forming a photo-alignment film will be described below.

The polarizer A may include other alignment films in addition to the photo-alignment film.

Examples of the other alignment films include an alignment film formed by a method such as a rubbing treatment performed on a film surface of an organic compound (preferably a polymer), oblique vapor deposition of an inorganic compound, formation of a layer having microgrooves, or accumulation of an organic compound (such as w-tricosanoic acid, dioctadecylmethylammonium chloride, or methyl stearylate) according to a Langmuir-Blodgett method (LB film), and an alignment film in which an alignment function is exerted by application of an electric field or application of a magnetic field.

In a case where the polarizer A includes an alignment film, the thickness thereof is not particularly limited, but is preferably in a range of 100 to 2000 nm and more preferably in a range of 400 to 1000 nm.

<<Method of Producing Polarizer A>>

The method of producing the polarizer A is not particularly limited as long as the polarizer A has a curved surface and the absorption axes are aligned such that the position Z satisfying specific requirements appears, and a known production method can be employed.

As a more specific method of producing the polarizer A, for example, a method of forming a photo-alignment film on the surface of the resin base material and forming a light absorption anisotropic layer formed of the composition for forming a light absorption anisotropic layer on the surface of the formed photo-alignment film may be exemplified.

<Method of Forming Photo-Alignment Film>

A method of forming the photo-alignment film is not particularly limited, and examples thereof include a production method including a coating step of coating a surface of a resin base material with the composition for forming a photo-alignment film to form a coating film and a light irradiation step of irradiating the coating film of the composition for forming a photo-alignment film with polarized light or non-polarized light to form a photo-alignment film.

The coating step is a step of coating the surface of a resin base material with the composition for forming a photo-alignment film to form a coating film.

Examples of the method of coating the base material with the composition for forming a photo-alignment film include a roll coating method, a gravure printing method, a spin coating method, a wire bar coating method, an extrusion coating method, a direct gravure coating method, a reverse gravure coating method, a die coating method, a spraying method, and an ink jet method.

A photo-alignment film is formed by performing a light irradiation step of irradiating the coating film formed by the coating step with polarized or non-polarized light.

Further, in a case where the coating film is irradiated with polarized light in the light irradiation step, the irradiation direction may be the normal direction of the coating film surface or may be an oblique direction with respect to the surface of the coating film. In a case where the coating film is irradiated with non-polarized light in the light irradiation step, the irradiation direction is an oblique direction with respect to the surface of the coating film.

Various light sources such as infrared rays, visible light, and ultraviolet rays can be used as the light source used in the light irradiation step, but ultraviolet rays are preferable.

Among these, in the light irradiation step, it is preferable that the coating film is irradiated with ultraviolet rays (hereinafter, also referred to as "polarized UV") in which the orientation of the polarization axis varies depends on the region where the ultraviolet rays are transmitted through the coating film and more preferable that the curved surface-like coating film formed of the composition for forming a photo-alignment film is irradiated with the polarized UV to achieve the aspect in which the position Z where the absorption axis of the polarizer A satisfies the specific requirements.

Examples of a method for forming a curved surface-like coating film formed of the composition for forming a photo-alignment film include a method of forming a coating film formed of a composition for forming a photo-alignment film on the surface of a resin base material molded into a curved surface shape, and a method of forming a coating film formed of a composition for forming a photo-alignment film on a planar resin base material and molding a laminate of the resin base material and the coating film formed of the composition for forming a photo-alignment film into a curved surface shape in a curved surface molding step described below.

In addition, examples of a method of irradiating the coating film with polarized UV include a method of irradiating the coating film with ultraviolet rays in which the orientation of the polarization axis varies depending on the position of the coating film by allowing ultraviolet rays to pass through a lens having a convex surface disposed on a side closer to a light source of the ultraviolet rays with respect to the coating film and changing the orientation of the polarization axis of the ultraviolet rays after having passed through the lens according to the position and the focal length of the lens through which ultraviolet rays are allowed to pass.

An alignment film having a curved surface portion and a plurality of regions where directions of the alignment regulating force are different from each other is formed by performing the above-described light irradiation step on the coating film.

<Method of Forming Light Absorption Anisotropic Layer>

The method of forming the light absorption anisotropic layer is not particularly limited, and examples thereof include a method including a step of forming a coating film by coating the surface of the photo-alignment film formed in the step of forming a photo-alignment film described above with the composition for forming a light absorption anisotropic layer described above (hereinafter, also referred to as "coating film forming step") and a step of aligning the liquid crystal component and/or the dichroic substance contained in the coating film (hereinafter, also referred to as "aligning step") in this order.

Further, the liquid crystal component is a component that also includes a dichroic substance having liquid crystallinity in a case where the above-described dichroic substance has liquid crystallinity, in addition to the above-described liquid crystal compound. Further, a light absorption anisotropic layer may be formed by using other alignment films in place of the photo-alignment film.

(Coating Film Forming Step)

The coating film forming step is a step of forming a coating film by coating the surface of the base material with a photo-alignment film on a side of the photo-alignment film with the composition for forming a light absorption anisotropic layer.

The surface of the photo-alignment film is easily coated with the composition for forming a light absorption anisotropic layer by using the composition for forming a light absorption anisotropic layer containing the solvent described above and/or using a liquid-like material such as a heated melt of the composition for forming a light absorption anisotropic layer.

Examples of the method of coating the base material with the composition for forming a light absorption anisotropic layer include known methods such as a roll coating method, a gravure printing method, a spin coating method, a wire bar coating method, an extrusion coating method, a direct gravure coating method, a reverse gravure coating method, a die coating method, a spraying method, and an ink jet method.

Among these, a spraying method of spray-coating the base material with a coating solution consisting of a composition for forming a light absorption anisotropic layer to form a coating film formed of the composition for forming a light absorption anisotropic layer is preferable.

The spray coating is a method of spraying a coating solution in the form of minute liquid droplets from a spray nozzle to coat an object to be coated. Examples of the kind of the nozzle include a one-fluid nozzle and a two-fluid nozzle, and both nozzles can be employed. In regard to the shape of the nozzle, nozzles having various shapes depending on the jetting amount and the spray pattern (fan-shaped, columnar, or shower-shaped) can be employed. In the spray coating, the thickness of the coating film can be controlled based on the concentration of the coating solution, the coating amount, and the distance between the substrate and the nozzle. For example, in a case where the concentration of the coating solution is identical, a thicker coating film is obtained as the coating amount increases or the distance between the substrate and the nozzle decreases.

In a case where a base material having a curved surface or a base material with a photo-alignment film (hereinafter, also referred to as "three-dimensional base material") is subjected to spray coating, it is preferable that the spray coating is performed while a three-dimensional base material serving as a mold is placed on a rotating stage, or the three-dimensional base material is vacuum-adsorbed by a spin chuck and the three-dimensional base material rotates.

(Aligning Step)

The aligning step is a step of aligning the liquid crystal component contained in the coating film. In this manner, a light absorption anisotropic layer is obtained.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

Here, the liquid crystal component contained in the composition for forming a light absorption anisotropic layer may be aligned by the coating film forming step or the drying treatment described above. For example, in an aspect in which the composition for forming a light absorption anisotropic layer is prepared as a coating solution containing a solvent, a coating film having light absorption anisotropy (that is, a light absorption anisotropic film) is obtained by drying the coating film and removing the solvent from the coating film.

In a case where the drying treatment is performed at a temperature higher than or equal to the transition temperature of the liquid crystal component contained in the coating film to the liquid crystal phase, the heat treatment described below may not be performed.

The transition temperature of the liquid crystal component contained in the coating film to the liquid crystal phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case of setting an isotropic liquid state at a temperature higher than the temperature range in which a liquid crystal phase is temporarily exhibited, and waste of thermal energy and deformation and deterioration of a substrate can be reduced.

It is preferable that the aligning step includes a heat treatment. In this manner, since the liquid crystal component contained in the coating film can be aligned, the coating film after being subjected to the heat treatment can be suitably used as the light absorption anisotropic film.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal component contained in the coating film can be fixed. The cooling means is not particularly limited and can be performed according to a known method.

The light absorption anisotropic film can be obtained by performing the above-described steps.

In the present aspect, examples of the method of aligning the liquid crystal component contained in the coating film include a drying treatment and a heat treatment, but the method is not limited thereto, and the liquid crystal component can be aligned by a known alignment treatment.

(Other Steps)

The method of forming the light absorption anisotropic layer may include a step of curing the light absorption anisotropic layer after the aligning step (hereinafter, also referred to as a "curing step").

The curing step is performed by heating the light absorption anisotropic layer and/or irradiating the layer with light (exposing the layer to light), for example, in a case where the light absorption anisotropic layer contains a crosslinkable group (polymerizable group). Between these, it is preferable that the curing step is performed by irradiating the layer with light.

Various light sources such as infrared rays, visible light, and ultraviolet rays can be used as the light source for curing, but ultraviolet rays are preferable. In addition, ultraviolet rays may be applied while the layer is heated during curing, or ultraviolet rays may be applied through a filter that transmits only a specific wavelength.

In a case where the exposure is performed while the layer is heated, the heating temperature during the exposure depends on the transition temperature of the liquid crystal components contained in the liquid crystal film to a liquid crystal phase, but is preferably in a range of 25° to 140° C.

Further, the exposure may be performed under a nitrogen atmosphere. In a case where the curing of the liquid crystal film proceeds by radical polymerization, from the viewpoint of reducing inhibition of polymerization by oxygen, it is preferable that exposure is performed in a nitrogen atmosphere.

<Curved Surface Molding Step>

It is preferable that the method of producing the polarizer A includes a step of molding a member selected from the group consisting of a planar base material, a laminate having a planar base material, and a planar polarizer into a curved surface shape by thermal molding or vacuum molding (hereinafter, also referred to as "curved surface molding step").

Examples of the method of molding the member into a curved surface shape include molding methods such as insert molding described in JP2004-322501A, vacuum molding, injection molding, pressure molding, decompression coating molding, in-mold transfer, and mold pressing, described in WO2010/001867A and JP2012-116094A.

It is also preferable to heat the member during molding the member into a curved surface shape. The heating temperature is preferably in a range of 80° C. to 170° C., more preferably in a range of 100° C. to 150° C., and still more preferably in a range of 110° C. to 140° C.

Further, the polarizer A may be prepared by preparing a resin base material having a curved surface portion in advance and forming a photo-alignment film and a light absorption anisotropic layer on the resin base material having a curved surface as necessary.

As the method of producing the polarizer A, it is preferable that an alignment film having a curved surface portion and a plurality of regions where directions of the alignment regulating force are different from each other is formed by a method of forming a photo-alignment film on the surface of the resin base material and a light absorption anisotropic layer is formed on the surface of the obtained alignment film by the method of forming a light absorption anisotropic layer described above. Here, the method of forming a light absorption anisotropic layer includes preferably a step of coating the base material with the composition for forming a light absorption anisotropic layer to form a light absorption anisotropic layer and more preferably a step of spray-coating the base material with the composition for forming a light absorption anisotropic layer to form a light absorption anisotropic layer.

Among these, it is preferable that the method of producing the polarizer A includes a coating step of coating the surface of a planar resin base material with a composition for forming a photo-alignment film to form a coating film, a curved surface molding step of molding the resin base material and the coating film into a curved surface shape, a light irradiation step of irradiating the coating film molded into a curved surface shape with polarized light or non-polarized light, a coating film forming step of coating (preferably spray-coating) the surface of the formed photo-alignment film with the composition for forming a light absorption anisotropic layer, and an aligning step of aligning the liquid crystal component contained in the formed coating film in this order.

However, the method of producing the polarizer A is not limited to the above-described example.

[Polarizer B]

The polarizer B is not particularly limited as long as the polarizer is an absorbing polarizer, and a known absorbing polarizer containing at least a dichroic substance can be used.

Examples of the polarizer B include a polarizer obtained by dying a film consisting of polyvinyl alcohol or other polymer resins with a dichroic substance and stretching the film to align the dichroic substance, and a polarizer including a light absorption anisotropic layer in which the dichroic substance is aligned by applying the alignment of the liquid crystal compound similarly to the polarizer A.

Among these, from the viewpoints of the availability and an increase in the degree of polarization, a polarizer obtained by stretching polyvinyl alcohol dyed with iodine is preferable.

In a case where the present optical element is used in an image display device, the polarizer B may be laminated on an image display element such as a liquid crystal display device or an organic EL display device provided in the image display device. In other words, in a case where the image display element has an absorbing polarizer on the viewing side, the absorbing polarizer may be used as the polarizer B.

In a case where the image display device does not include an absorbing polarizer, the polarizer B may be provided on the viewing side of the image display device.

[Image Display Device]

The image display device according to the embodiment of the present invention includes at least the present optical element and an image display element. In this manner, in an image display device formed of a reciprocation optical system having an absorbing polarizer with a curved surface portion, ghosts on an image displayed by the image display element can be further suppressed.

In addition, the image display device may include optical members such as a wave plate (such as a λ/4 plate or a λ/2 plate), a reflective linear polarizer, a reflective circular polarizer, an absorbing polarizer other than the polarizer A and the polarizer B, a half mirror, and an antireflection film.

First Embodiment

A first embodiment of the image display device according to the embodiment of the present invention will be described with reference to the accompanying drawings.

Figure 4:
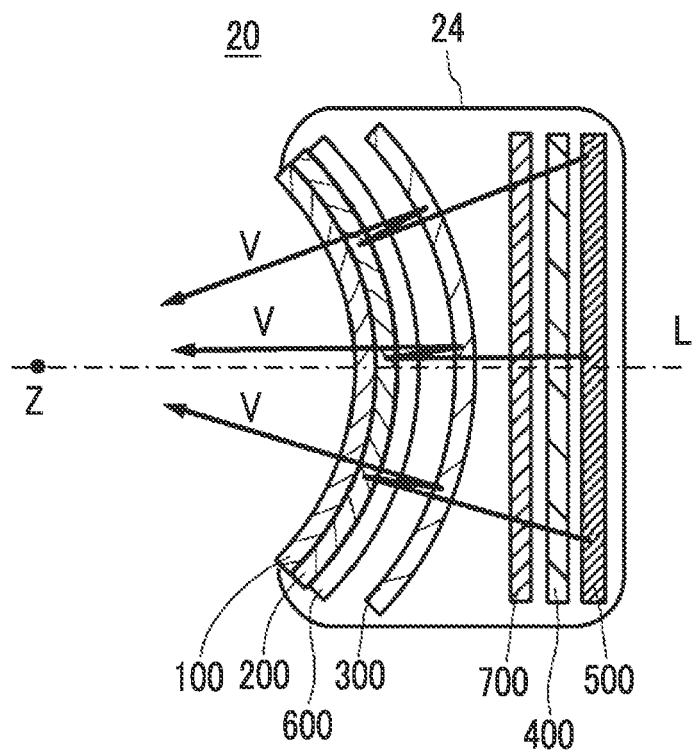
FIG. 4 is a schematic view illustrating a configuration of an image display device according to a first embodiment of the present invention.

FIG. 4 is a schematic view illustrating the configuration of the image display device according to the first embodiment.

An image display device 20 illustrated in FIG. 4 includes a polarizer A100, a reflective linear polarizer 200, a first λ/4 plate 600, a half mirror 300, a second λ/4 plate 700, a polarizer B400, an image display element 500, and a housing 24, and the image display device 20 has the position Z that satisfies the specific requirements on the straight line L.

Among the members of the image display device 20, the present optical element is formed of the polarizer A100, the reflective linear polarizer 200, the first λ/4 plate 600, the half mirror 300, the second λ/4 plate 700, and the polarizer B400.

As described below in more detail, the ray V in the image display device 20 is observed as a display image at the position Z after being reflected by the reflective linear polarizer 200 and the half mirror 300. That is, the ray V has an optical path that reciprocates between the reflective linear polarizer 200 and the half mirror 300.

The image display device 20 according to the present embodiment is configured such that the position Z where the polarizer A100 and the polarizer B400 satisfy the specific requirements is present, and thus ghosts occurring in a display image observed at the position Z can be effectively suppressed.

Each member of the image display device according to the present embodiment will be described. The polarizer A and the polarizer B are as described above.

Further, the definitions of the positions X, Y and Z, the straight line L, and the virtual lines L1 to L4 in the description of the image display device below are the same as the positions X, Y and Z, the straight line L, and the virtual lines L1 to L4 in the present optical element described above.

<λ/4 Plate>

The image display device according to the present embodiment includes a first λ/4 plate and a second λ/4 plate.

Further, the simple notation of "λ/4 plate" in the present specification denotes that the descriptions of the configuration and the features can be applied to both the first λ/4 plate and the second λ/4 plate without distinction.

In the λ/4 plate included in the image display device according to the present embodiment, the direction of the slow axis is set to convert linearly polarized light into circularly polarized light and circularly polarized light into linearly polarized light.

A λ/4 plate (¼ wavelength retardation plate) may have a retardation of an approximately ¼ wavelength at any wavelength in a visible range. Examples of the λ/4 plate include a retardation plate having a retardation of 120 to 150 nm at a wavelength of 550 nm, and a retardation plate having a retardation of approximately 138 nm (138±10 nm) at a wavelength of 550 nm is suitably used.

From the viewpoint of suppressing ghosts on a display image and further improving display performance such as brightness and color reproducibility, it is preferable that the λ/4 plate has reverse dispersibility with respect to the wavelength. Here, the expression "having reverse dispersibility with respect to the wavelength" denotes that as the wavelength increases, the value of the retardation at the wavelength increases.

As the λ/4 plate, known λ/4 plates can be used without limitation, and examples thereof include a stretched polycarbonate film and a retardation film obtained by curing a liquid crystal compound. From the viewpoint of reducing the thickness, it is preferable to use the retardation film prepared by curing a liquid crystal compound.

The first λ/4 plate may have a curved surface. The first λ/4 plate has a convex surface on a side of the image display element, preferably a rotary surface in which the surface on the viewing side is a concave surface, and more preferably a curved surface with a constant curvature radius.

The curvature radius in a case where the first λ/4 plate has a curved surface with a constant curvature radius can be appropriately selected depending on the size and applications of the optical element and the image display device, but is preferably in a range of 20 to 1000 mm and more preferably in a range of 30 to 200 mm.

(Slow Axis of λ/4 Plate)

In the slow axis of the first λ/4 plate of the image display device according to the present embodiment, on a straight line connecting the position Z and the polarizer B, the angle between a local absorption axis at an intersection of the polarizer A and the straight line and a local slow axis at an intersection of the first λ/4 plate and the straight line is preferably 45°.

More specifically, it is preferable that the first λ/4 plate and the polarizer A satisfy all the following requirements.

The angle between the direction of the absorption axis of the polarizer A at the position X and the direction of the slow axis of the first λ/4 plate at the intersection of the straight line L and the first λ/4 plate is 45° as observed in the direction in which the straight line L extends.

The angle between the direction of the absorption axis of the polarizer A at the intersection of the virtual line L1 and the polarizer A and the direction of the slow axis of the first λ/4 plate at the intersection of the virtual line L1 and the first λ/4 plate is 45° as observed in the direction in which the virtual line L1 extends.

The angle between the direction of the absorption axis of the polarizer A at the intersection of the virtual line L2 and the polarizer A and the direction of the slow axis of the first λ/4 plate at the intersection of the virtual line L2 and the first λ/4 plate is 45° as observed in the direction in which the virtual line L2 extends.

The angle between the direction of the absorption axis of the polarizer A at the intersection of the virtual line L3 and the polarizer A and the direction of the slow axis of the first λ/4 plate at the intersection of the virtual line L3 and the first λ/4 plate is 45° as observed in the direction in which the virtual line L3 extends.

The angle between the direction of the absorption axis of the polarizer A at the intersection of the virtual line L4 and the polarizer A and the direction of the slow axis of the first λ/4 plate at the intersection of the virtual line L4 and the first λ/4 plate is 45° as observed in the direction in which the virtual line L4 extends.

In a case where the slow axis of the first λ/4 plate satisfies all the above-described requirements, ghosts can be effectively suppressed over the entire region of the optical element.

In the image display device according to the present embodiment, in a case of assuming the straight line Lz connecting the position Z and the polarizer B, it is preferable that the relationship between the position A, the polarizer A, and the first λ/4 plate in which the angle between the direction of the local absorption axis of the polarizer A at the intersection with the straight line Lz and the direction of the local slow axis of the first λ/4 plate at the intersection with the straight line Lz is 45° as observed in the direction in which the straight line Lz extends is satisfied over the entire region of the polarizer B. Further, the expression "relationship is satisfied over the entire region of the polarizer B" denotes that the relationship is satisfied as long as the point to be connected to the position Z to draw the straight line Lz is present on the surface of the polarizer B on the viewing side. In this manner, ghosts can be more effectively suppressed over the entire region of an image displayed by the image display device according to the present embodiment.

Further, on the straight line connecting the position Z and the polarizer B in the image display device according to the present embodiment, it is preferable that the local slow axis at the intersection of the first λ/4 plate and the straight line and the local slow axis at the intersection of the second λ/4 plate and the straight line is orthogonal to each other.

More specifically, it is preferable that the first λ/4 plate and the second λ/4 plate satisfy all the following requirements.

The direction of the slow axis of the first λ/4 plate at the intersection of the straight line L and the first λ/4 plate and the direction of the slow axis of the second λ/4 plate at the intersection of the straight line L and the second λ/4 plate are orthogonal to each other as observed in the direction in which the straight line L extends.

The direction of the slow axis of the first λ/4 plate at the intersection of the virtual line L1 and the first λ/4 plate and the direction of the slow axis of the second λ/4 plate at the intersection of the virtual line L1 and the second λ/4 plate are orthogonal to each other as observed in the direction in which the virtual line L1 extends.

The direction of the slow axis of the first λ/4 plate at the intersection of the virtual line L2 and the first λ/4 plate and the direction of the slow axis of the second λ/4 plate at the intersection of the virtual line L2 and the second λ/4 plate are orthogonal to each other as observed in the direction in which the virtual line L2 extends.

The direction of the slow axis of the first λ/4 plate at the intersection of the virtual line L3 and the first λ/4 plate and the direction of the slow axis of the second λ/4 plate at the intersection of the virtual line L3 and the second λ/4 plate are orthogonal to each other as observed in the direction in which the virtual line L3 extends.

The direction of the slow axis of the first λ/4 plate at the intersection of the virtual line L4 and the first λ/4 plate and the direction of the slow axis of the second λ/4 plate at the intersection of the virtual line L4 and the second λ/4 plate are orthogonal to each other as observed in the direction in which the virtual line L4 extends.

In a case where the slow axis of the first λ/4 plate and the slow axis of the second λ/4 plate satisfy all the above-described requirements, ghosts can be effectively suppressed over the entire region of the optical element.

In the image display device according to the present embodiment, in a case of assuming the straight line Lz connecting the position Z and the polarizer B, it is preferable that the relationship between the position Z, the first λ/4 plate, and the second λ/4 plate in which the local slow axis of the first λ/4 plate at the intersection with the straight line Lz and the local slow axis of the second λ/4 plate at the intersection with the straight line Lz are orthogonal to each other as observed in the direction in which the straight line Lz extends is satisfied over the entire region of the polarizer B. In this manner, ghosts can be more effectively suppressed over the entire region of an image displayed by the image display device according to the present embodiment.

The direction of the slow axis of the λ/4 plate at the intersection of the straight line L or the virtual lines L1 to L4 and the λ/4 plate can be measured by disposing the first λ/4 plate or the second λ/4 plate in place of the polarizer A or the polarizer B in conformity with the method of measuring the direction of the absorption axis of the polarizer A or the polarizer B using AxoScan described in the section [Method of specifying position Z] above.

<Reflective Linear Polarizer>

The image display device according to the present embodiment includes a reflective linear polarizer.

The reflective linear polarizer has a function of reflecting a part of light emitted from the image display element and reciprocating the light inside the optical system. From the viewpoint of suppressing ghosts, it is preferable that the reflective linear polarizer has a high degree of polarization.

As the reflective linear polarizer, a known reflective linear polarizer can be used without limitation, and examples thereof include a film obtained by stretching a dielectric multilayer film and a wire grid polarizer as described in JP2011-053705A. Suitable examples of commercially available products of the reflective linear polarizer include a reflective polarizer (trade name: APF, manufactured by 3M Company) and a wire grid polarizer (trade name: WGF, manufactured by Asahi Kasei Corporation).

The reflective linear polarizer may have a curved surface. The reflective linear polarizer has a convex surface on a side of the image display element, preferably a rotary surface in which the surface on the viewing side is a concave surface, and more preferably a curved surface with a constant curvature radius.

The curvature radius in a case where the reflective linear polarizer has a curved surface with a constant curvature radius can be appropriately selected depending on the size and applications of the optical element and the image display device, but is preferably in a range of 20 to 1000 mm and more preferably in a range of 30 to 200 mm.

In the reflection axis of the reflective linear polarizer of the image display device according to the present embodiment, on a straight line connecting the position Z and the polarizer B, it is preferable that the local absorption axis at an intersection of the polarizer A and the straight line and the local reflection axis at an intersection of the reflective linear polarizer and the straight line are parallel to each other.

More specifically, it is preferable that the reflective linear polarizer and the polarizer A satisfy all the following requirements.

The direction of the absorption axis of the polarizer A at the position X and the direction of the reflection axis of the reflective linear polarizer at the intersection of the straight line L and the reflective linear polarizer are parallel to each other as observed in the direction in which the straight line L extends.

The direction of the absorption axis of the polarizer A at the intersection of the virtual line L1 and the polarizer A and the direction of the reflection axis of the reflective linear polarizer at the intersection of the virtual line L1 and the reflective linear polarizer are parallel to each other as observed in the direction in which the virtual line L1 extends.

The direction of the absorption axis of the polarizer A at the intersection of the virtual line L2 and the polarizer A and the direction of the reflection axis of the reflective linear polarizer at the intersection of the virtual line L2 and the reflective linear polarizer are parallel to each other as observed in the direction in which the virtual line L2 extends.

The direction of the absorption axis of the polarizer A at the intersection of the virtual line L3 and the polarizer A and the direction of the reflection axis of the reflective linear polarizer at the intersection of the virtual line L3 and the reflective linear polarizer are parallel to each other as observed in the direction in which the virtual line L3 extends.

The direction of the absorption axis of the polarizer A at the intersection of the virtual line L4 and the polarizer A and the direction of the reflection axis of the reflective linear polarizer at the intersection of the virtual line L4 and the reflective linear polarizer are parallel to each other as observed in the direction in which the virtual line L4 extends.

In a case where the local reflection axis of the reflective linear polarizer satisfies all the above-described requirements, ghosts can be effectively suppressed over the entire region of the optical element.

In the image display device according to the present embodiment, in a case of assuming the straight line Lz connecting the position Z and the polarizer B, it is preferable that the relationship between the position Z, the polarizer A, and the reflective linear polarizer in which the absorption axis of the polarizer A at the intersection with the straight line Lz and the reflection axis of the reflective linear polarizer are parallel to each other as observed in the direction in which the straight line Lz extends is satisfied over the entire region of the polarizer B. In this manner, ghosts can be more effectively suppressed over the entire region of an image displayed by the image display device according to the present embodiment.

The direction of the reflection axis of the reflective linear polarizer at the intersection of the straight line L or the virtual lines L1 to L4 and the reflective linear polarizer can be measured by disposing the reflective linear polarizer in place of the polarizer A or the polarizer B in conformity with the method of measuring the direction of the absorption axis of the polarizer A or the polarizer B using AxoScan described in the section [Method of specifying position Z] above.

<Half Mirror>

The image display device according to the present embodiment includes a half mirror.

The half mirror is not particularly limited, and known half mirrors such as a half mirror obtained by vapor-depositing aluminum on a glass plate, and a half mirror obtained by vapor-depositing aluminum on a transparent resin plate consisting of a resin such as polyethylene terephthalate (PET), a cycloolefin polymer (COP), or polymethyl methacrylate (PMMA) can be used.

The transmittance of the half mirror is not particularly limited, but is preferably 50±30%, more preferably 50±10%, and still more preferably 50%.

The half mirror may have a curved surface. The half mirror has a convex surface on a side of the image display element, preferably a rotary surface in which the surface on the viewing side is a concave surface, and more preferably a curved surface with a constant curvature radius.

The curvature radius in a case where the half mirror has a curved surface with a constant curvature radius can be appropriately selected depending on the size and applications of the optical element and the image display device, but is preferably in a range of 20 to 1000 mm and more preferably in a range of 30 to 200 mm.

<Image Display Element>

A known image display element can be used as the image display element, and examples thereof include a liquid crystal display, an organic electroluminescence display, and a micro light emitting diode (LED) display.

The housing is not particularly limited as long as the housing is a member that accommodates and supports the above-described optical member, and a housing having a proper form is appropriately selected according to the applications of the image display device. Examples of the shape of the housing include the shape of goggles, the shape of a pair of spectacle frames, and the shape of a helmet.

A specific aspect of use of the image display device according to the present embodiment will be described with reference to FIG. 4.

In the following description and the description of the aspect of use of the image display device according to a second embodiment described below, the direction in which the local absorption axis of the polarizer A is oriented at the position where the ray V is incident on the polarizer A is defined as "lateral direction", and the direction in which the local absorption axis of the polarizer B is oriented at the position where the ray V is incident on the polarizer B is defined as "longitudinal direction".

In the image display device 20, the image display element 500 emits non-polarized light, the slow axis of the λ/4 plate 700 is set to convert laterally linearly polarized light incident from the side of the image display element 500 into dextrorotatory circularly polarized light, the slow axis of the λ/4 plate 600 is set to convert the levorotatory circularly polarized light incident from the side of the image display element 500 into longitudinally linearly polarized light, and the reflection axis of the reflective linear polarizer 200 is in the lateral direction.

In the image display device 20 illustrated in FIG. 4, the ray V of the non-polarized light emitted from the image display element 500 is converted into laterally linearly polarized light by absorbing the component in the longitudinal direction in the polarizer B400, and is incident on the λ/4 plate 700.

The laterally linearly polarized light incident on the λ/4 plate 700 is converted into dextrorotatory circularly polarized light by the λ/4 plate 700 and is incident on the half mirror 300.

Approximately half of the dextrorotatory circularly polarized light incident on the half mirror 300 is transmitted through the half mirror 300 and is incident on the λ/4 plate 600, and approximately the remaining half is reflected.

The dextrorotatory circularly polarized light incident on the λ/4 plate 600 from the image display element 500 side is converted into laterally linearly polarized light by the λ/4 plate 600 and is incident on the reflective linear polarizer 200.

As described above, since the reflection axis of the reflective linear polarizer 200 is in the lateral direction, the laterally linearly polarized light incident on the reflective linear polarizer 200 is reflected by the reflective linear polarizer 200 and is incident on the λ/4 plate 600 again as laterally linearly polarized light from the viewing side (on the side of the position Z).

The laterally linearly polarized light incident on the λ/4 plate 600 from the viewing side is converted into dextrorotatory circularly polarized light by the λ/4 plate 600 and is incident on the half mirror 300 again.

Approximately half of the dextrorotatory circularly polarized light incident on the half mirror 300 is transmitted through the half mirror 300, and approximately the remaining half is reflected by the half mirror 300 and is incident on the λ/4 plate 600 three times as levorotatory circularly polarized light.

The levorotatory circularly polarized light incident on the λ/4 plate 600 from the side of the image display element 500 is converted into longitudinally linearly polarized light and is incident on the reflective linear polarizer 200.

The longitudinally linearly polarized light incident on the reflective linear polarizer 200 is transmitted through the reflective linear polarizer 200 and the polarizer A100 and reaches the viewing side (position Z).

In the image display device 20 according to the present embodiment, the ray V emitted from the image display element 500 passes through the reciprocating optical path between the reflective linear polarizer 200 and the half mirror 300 as described above and is observed as a display image at the position Z.

The image display device 20 according to the present embodiment has a position Z that satisfies the specific requirements. In this manner, even in a case where the laterally linearly polarized light incident on the reflective linear polarizer 200 for the first time is transmitted through the reflective linear polarizer 200 without being sufficiently reflected, since the polarizer A having an absorption axis in the lateral direction absorbs laterally linearly polarized light, the transmission of the ray that does not pass through the reciprocating optical path can be suppressed, and ghosts on the display image to be observed can be suppressed.

In particular, in the image display device 20 according to the present embodiment, the effect of suppressing ghosts is more significantly exhibited in a display image obtained by observation from the position Z as the image is displayed in a region closer to a peripheral portion of the image display element 500, that is, the angle between the straight line connecting the position Z and the image display region and the straight line L increases.

Second Embodiment

The second embodiment of the image display device according to the present invention will be described.

Figure 5:
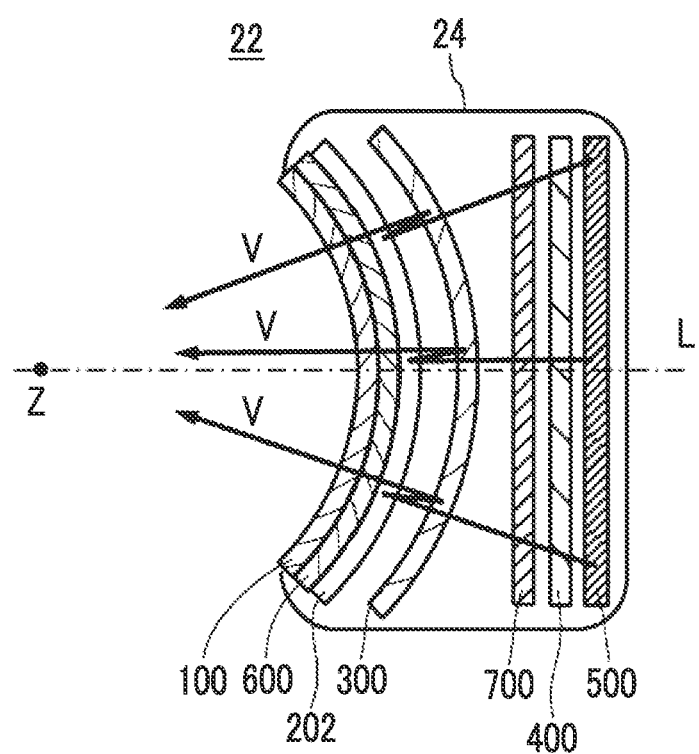
FIG. 5 is a schematic view illustrating a configuration of an image display device according to a second embodiment of the present invention.

FIG. 5 is a schematic view illustrating the configuration of an image display device according to the second embodiment.

The image display device 22 illustrated in FIG. 5 includes the polarizer A 100, the first λ/4 plate 600, a reflective circular polarizer 202, the half mirror 300, the second λ/4 plate 700, the polarizer B400, the image display element 500, and the housing 24, and the image display device 22 has the position Z that satisfies specific requirements on the straight line L.

The present optical element is formed of the polarizer A100, the first λ/4 plate 600, the reflective circular polarizer 202, the half mirror 300, the second λ/4 plate 700, and the polarizer B400 among the members included in the image display device 22.

In the image display device 22, the ray V is reflected by the reflective circular polarizer 202 and the half mirror 300 and observed at the position Z as a display image. That is, the ray V has an optical path that reciprocates between the reflective circular polarizer 202 and the half mirror 300.

The image display device 22 according to the present embodiment is configured such that the position Z where the polarizer A100 and the polarizer B400 satisfy the specific requirements, and thus ghosts occurred in the display image observed at the position Z can be effectively suppressed.

Each member of the image display device according to the present embodiment will be described. The polarizer A, the polarizer B, the first and second λ/4 plates, the half mirror, and the image display element are as described above.

<Reflective Circular Polarizer>

The image display device according to the present embodiment includes a reflective circular polarizer.

The reflective circular polarizer is a polarizer that transmits dextrorotatory circularly polarized light or levorotatory circularly polarized light and reflects circularly polarized light whose revolution direction is opposite to that of circularly polarized light to be transmitted, and has a function of reflecting a part of the light emitted from the image display element and reciprocating the light inside the optical system in the image display device according to the present embodiment. From the viewpoint of suppressing ghosts, it is preferable that the degree of polarization of the reflective circular polarizer increases.

Examples of the reflective circular polarizers include a reflective circular polarizer having a cholesteric liquid crystal layer. A cholesteric liquid crystal layer is a layer having a liquid crystal phase in which the liquid crystal compound is in a cholesteric alignment state (cholesteric liquid crystalline phase). As the reflective circular polarizer having a cholesteric liquid crystal layer, a film or the like obtained by curing a liquid crystal compound in a state exhibiting a cholesteric liquid crystalline phase can be suitably used.

In a case where the reflective circular polarizer is used, since the ray transmitted through the reflective circular polarizer is converted into circularly polarized light, an optical member that converts circularly polarized light into linearly polarized light, more specifically, the first λ/4 plate is installed between the polarizer A and the reflective circular polarizer. In this manner, the ray transmitted through the reflective circular polarizer is converted into linearly polarized light and is incident on the polarizer A.

A specific aspect of use of the image display device according to the present embodiment will be described with reference to FIG. 5.

In the image display device 22, the image display element 500 emits non-polarized light, the slow axis of the λ/4 plate 700 is set to convert laterally linearly polarized light incident from the side of the image display element 500 into dextrorotatory circularly polarized light, the slow axis of the λ/4 plate 600 is set to convert levorotatory circularly polarized light incident from the side of the image display element 500 into longitudinally linearly polarized light, and the reflective circular polarizer 202 reflects dextrorotatory circularly polarized light and transmits levorotatory circularly polarized light.

In the image display device 22 illustrated in FIG. 5, the ray V of non-polarized light emitted from the image display element 500 is converted into laterally linearly polarized light by absorbing the component in the longitudinal direction in the polarizer B400, and is incident on the λ/4 plate 700.

The laterally linearly polarized light incident on the λ/4 plate 700 is converted into dextrorotatory circularly polarized light by the λ/4 plate 700 and is incident on the half mirror 300.

Approximately half of the dextrorotatory circularly polarized light incident on the half mirror 300 is transmitted through the half mirror 300 and is incident on the λ/4 plate 600, and approximately the remaining half is reflected.

The dextrorotatory circularly polarized light incident on the reflective circular polarizer 202 is reflected by the reflective circular polarizer 202 and is incident on the half mirror 300 as dextrorotatory circularly polarized light.

Approximately half of the dextrorotatory circularly polarized light incident on the half mirror 300 is transmitted through the half mirror 300, and approximately the remaining half is reflected by the half mirror 300, converted into levorotatory circularly polarized light, and is incident on the reflective circular polarizer 202 again.

The levorotatory circularly polarized light incident on the reflective circular polarizer 202 is transmitted through the reflective circular polarizer 202 and is incident on the λ/4 plate 600.

The levorotatory circularly polarized light incident on the λ/4 plate 600 from the side of the image display element 500 is converted into longitudinally linearly polarized light by the λ/4 plate 600 and is incident on the polarizer A100.

The longitudinally linearly polarized light incident on the polarizer A100 is transmitted through the polarizer A100 and reaches the viewing side (position Z).

In the image display device 22 according to the present embodiment, the ray V emitted from the image display element 500 passes through the reciprocating optical path between the reflective circular polarizer 202 and the half mirror 300 as described above and is observed as a display image at the position Z.

The image display device 22 according to the present embodiment has a position Z that satisfies the specific requirements. In this manner, even in a case where the dextrorotatory polarized light incident on the reflective circular polarizer 202 for the first time is transmitted through the reflective circular polarizer 202 without being sufficiently reflected, since the transmitted dextrorotatory circularly polarized light is converted into laterally linearly polarized light by the λ/4 plate 600 and the polarizer A having an absorption axis in the lateral direction absorbs linearly polarized light, the transmission of the ray that does not pass through the reciprocating optical path can be suppressed, and ghosts on the display image to be observed can be suppressed.

In particular, in the image display device 22 according to the present embodiment, the effect of suppressing ghosts is more significantly exhibited in a display image obtained by observation from the position Z as the image is displayed in a region closer to a peripheral portion of the image display element 500, that is, the angle between the straight line connecting the position Z and the image display region and the straight line L increases.

The configuration of the image display device according to the present invention is not limited to the above-described embodiments.

The image display device may include other functional layers in addition to those described above. Examples of the other functional layers include a pressure sensitive adhesive layer, an adhesive layer, an antireflection layer, and a protective layer.

The image display device further includes preferably two optical members selected from the group consisting of a reflective linear polarizer, a reflective circular polarizer, and a half mirror in addition to at least the polarizer A, the polarizer B, and the image display device and more preferably any one of a reflective linear polarizer and a reflective circular polarizer, and a half mirror.

The method of producing the image display device is not particularly limited and may include a step of preparing each of the above-described optical members and bonding the members with a pressure sensitive adhesive or an adhesive. Further, the method may further include, for example, a step of transferring the optical member formed on a temporary base material to another optical member.

Each step can be carried out according to a known method.

[Applications of Image Display Device]

The applications of the image display device are not particularly limited, and it is preferable that the image display device is used as a near-eye display from the viewpoint that ghosts on a display image are suppressed and the size and the thickness of the device can be easily reduced. More specifically, the above-described image display device can be used as an image display device installed in optical devices such as a virtual reality display device, an augmented reality display device, an electronic viewfinder used in a digital camera, an optical telescope, and an optical microscope.

EXAMPLES

Hereinafter, the features of the present invention will be described in more detail with reference to the following examples. The materials, the used amounts, the ratios, the treatment contents, the treatment procedures, and the like described in the following examples can be appropriately changed without departing from the gist of the present invention. In addition, configurations other than the configurations described below can be employed without departing from the gist of the present invention.

Example 1

<Preparation of Photo-Alignment Film>

A resin base material "TECHNOLLOY C001" (polycarbonate/PMMA laminated base material, 75 μm in thickness, manufactured by Sumika Acryl Co., Ltd.) was continuously coated with a coating solution PA1 for forming a photo-alignment film with a wire bar, thereby forming a coating film. The base material on which the coating film was formed was dried with hot air at 140° C. for 120 seconds to obtain a base material with a photo-alignment film.

The thickness of the photo-alignment film was 0.3 μm.

| (Coating solution PA1 for forming photo-alignment film) | |
|---|---|
| Polymer PA-1 shown below | 100.00 parts by mass |
| Acid generator PAG-1 shown below | 5.00 parts by mass |
| Acid generator CPI-110TF shown below | 0.005 parts by mass |
| Xylene | 1220.00 parts by mass |
| Methyl isobutyl ketone | 122.00 parts by mass |

Polymer PA-1

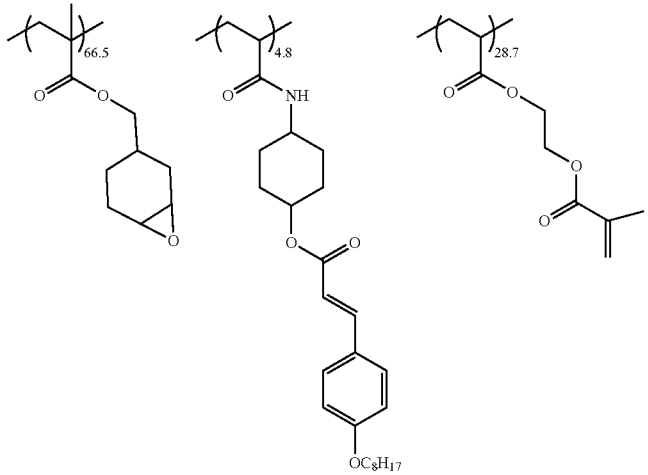

Acid generator PAG-1

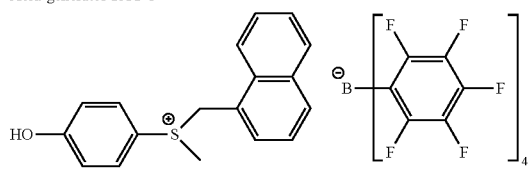

Acid generator CPI-110F

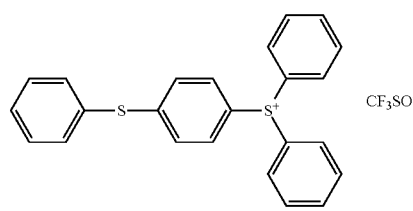

<Molding of Photo-Alignment Film>

With reference to JP2012-116094A, the base material with the photo-alignment film described above was vacuum-molded on the convex surface of a plano-convex lens (made of optical glass, curvature radius of the convex surface: 100 mm) having a diameter of 40 mm and a focal length of 200 mm. Thereafter, the base material with the photo-alignment film was peeled off from the lens, thereby obtaining a laminate including the base material and the photo-alignment film having a curved surface portion.

<Alignment Treatment of Photo-Alignment Film>

Ultraviolet rays generated using an ultra-high pressure mercury lamp were allowed to be incident on a convex lens with a diameter of 100 mm and a focal length of 300 mm to condense the ultraviolet rays. Next, the ultraviolet rays were converted into polarized light UV by placing a wire grid polarizer at a position separated by 70 mm from the convex lens on a side opposite to the side of the ultra-high pressure mercury lamp with respect to the convex lens. Further, the photo-alignment film was subjected to an alignment treatment by placing the photo-alignment film having a curved surface obtained above at a position separated by 150 mm from the convex lens such that the convex side of the curved surface faced the ultra-high pressure mercury lamp and the convex lens and exposing the photo-alignment film to polarized light UV at an illuminance of 10 mJ/cm$^2$.

By aligning the alignment axis of the photo-alignment film by the above-described method, the surface of the photo-alignment film had a plurality of regions where the directions of the absorption axes were different from each other (see FIG. 3), and a photo-alignment film capable of forming a light absorption anisotropic layer in which the angle between the direction of the absorption axis of the polarizer A and the direction of the absorption axis of the polarizer B described below was 90° over the entire region of the polarizer B as observed from the position Z was obtained.

<Preparation of Composition for Forming Light Absorption Anisotropic Layer>

A composition P1 for forming a light absorption anisotropic layer having the following composition was prepared.

| Composition of composition P1 for forming light absorption anisotropic layer | |
|---|---|
| Dichroic substance D-1 shown below | 0.05 parts by mass |
| Dichroic substance D-2 shown below | 0.07 parts by mass |
| Dichroic substance D-3 shown below | 0.12 parts by mass |
| Polymer liquid crystal compound P-1 shown below | 0.44 parts by mass |
| Low-molecular-weight liquid crystal compound M-1 shown below | 0.27 parts by mass |
| Polymerization initiator IRGACURE OXE-02 (manufactured by BASF SE) | 0.040 parts by mass |
| Surfactant F-1 shown below | 0.005 parts by mass |
| Cyclopentanone | 48.0 parts by mass |
| Tetrahydrofuran | 48.0 parts by mass |
| Benzyl alcohol | 3.00 parts by mass |

D-1

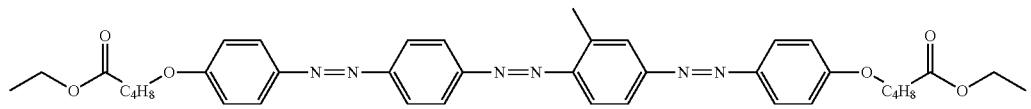

D-2

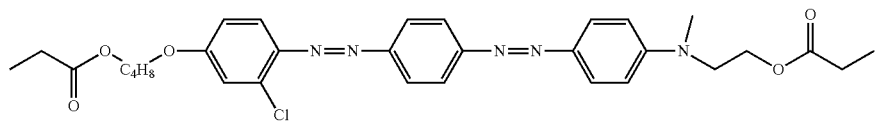

D-3

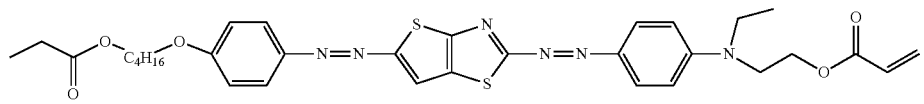

Polymer liquid crystal compund P-1

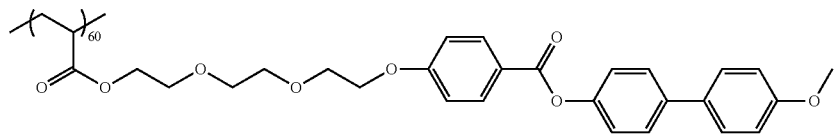

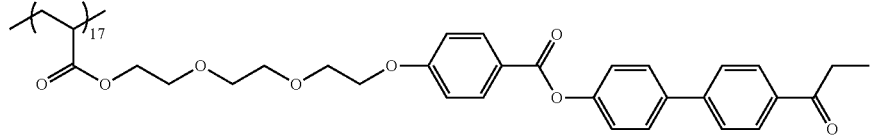

| Composition of composition P1 for forming light absorption anisotropic layer |
|---|

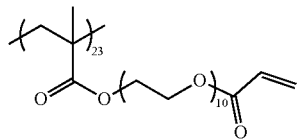

Low-molecular-weight liquid crystal compund M-1

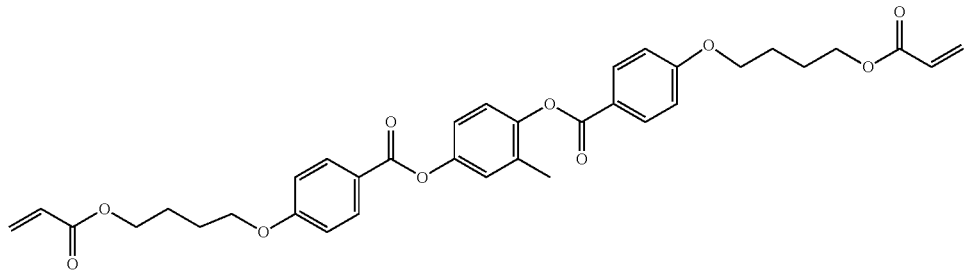 [SMILES: C=CC(=O)OCCCCOc1ccc(C(=O)Oc2ccc(OC(=O)c3ccc(OCCCCOC(=O)C=C)cc3)c(C)c2)cc1]

Surfactant F-1

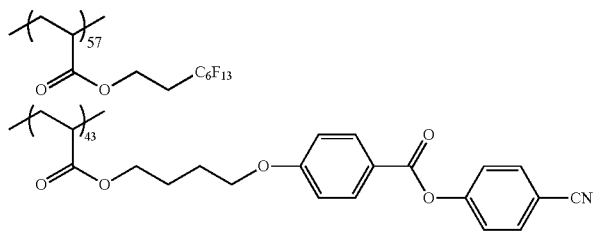

<Preparation of Polarizer A>

A coating layer P1 was formed by performing a coating film forming step of spray-coating the surface of the photo-alignment film having a curved surface subjected to the alignment treatment described above with the composition for forming a light absorption anisotropic layer using a coater "rCoater" (manufactured by Asahi Sunac Corporation).

Next, an aligning step of heating the coating layer P1 at 140° C. for 30 seconds, cooling the coating layer P1 to room temperature (23° C.), heating the coating layer P1 at 90° C. for 60 seconds again, and cooling the coating layer P1 to room temperature again was carried out.

Thereafter, a curing step of irradiating the coating layer P1 with light having a central wavelength of 365 nm using an LED lamp for 2 seconds under irradiation conditions of an illuminance of 200 mW/cm$^2$, thereby forming a light absorption anisotropic layer.

In this manner, an absorbing polarizer A including a base material, a photo-alignment film, and a light absorption anisotropic layer and having a curved surface portion was prepared.

The film thickness of the light absorption anisotropic layer of the obtained absorbing polarizer A was 1.6 μm.

<Preparation and Molding of λ/4 Plate>

With reference to JP2018-010224A and the like, a λ/4 plate having reverse dispersibility was prepared by curing a liquid crystal composition containing a liquid crystal compound. Next, the prepared λ/4 plate was transferred to the above-described resin base material "TECHNOLLOY C001" using a UV curing adhesive.

The obtained λ/4 plate with a resin base material was vacuum-molded by the method described in the section of <Molding of photo-alignment film> above, thereby obtaining λ/4 plate having a curved surface in a shape along with the convex surface of the plano-convex lens with a curvature radius of 100 mm.

<Molding of Reflective Linear Polarizer>

A reflective linear polarizer "APF" (manufactured by 3M Company) was vacuum-molded by the method described in <Molding of photo-alignment film>above, thereby obtaining a reflective linear polarizer λ/4 plate having a shape along with the convex surface of the plano-convex lens with a curvature radius of 100 mm.

[Production of Image Display Device]

The virtual reality display device "Huawei VR Glass" (manufactured by Huawei Technologies Japan K.K.), which is a virtual reality display device that employs a reciprocation optical system, was disassembled, and the lens disposed closest to the viewing side and the half mirror disposed on the viewing side next to the lens were removed. Further, the "Huawei VR Glass" from which the lens had been removed had a λ/4 plate, an absorbing polarizer, and an image display element disposed in order from the viewing side.

Next, a laminated lens was prepared by sequentially bonding the absorbing polarizer A, the reflective linear polarizer, and the λ/4 plate prepared by the above-described method on the convex surface side of the plano-convex lens with a diameter of 40 mm and a focal length of 200 mm. The Huawei VR Glass was assembled again by using the laminated lens prepared in the above-described manner in place of the removed viewing-side lens and using a previously prepared half mirror (curvature radius of 100 mm) in place of the removed half mirror, thereby producing a virtual reality display device of Example 1.

The produced virtual reality display device of Example 1 had the configuration illustrated in FIG. 4. That is, in the virtual reality display device of Example 1, the absorbing polarizer A, the reflective linear polarizer, the first λ/4 plate, the half mirror, the second λ/4 plate, the absorbing polarizer B, and the image display element were disposed in order from the viewing side. All the absorbing polarizer A, the first λ/4 plate, the reflective linear polarizer, and the half mirror had a curved surface portion, with the concave surface facing the viewing side and the convex surface facing the side of the image display element. Further, the second λ/4 plate and the absorbing polarizer B were planar.

As a result of performing a test of the above-described method of specifying the position Z on the virtual reality display device of Example 1, the position Z satisfying the specific requirements was confirmed to be present on the straight line L. That is, in the virtual reality display device of Example 1, it was found that the position Z where the angle between the absorption axis of the polarizer A and the absorption axis of the polarizer B was 90° was present in a case where the directions of the straight line L and the virtual lines L1 to L4 were observed.

Further, as a result of the measurement using the above-described measuring method with the virtual reality display device of Example 1, it was found that the absorption axis of the polarizer A and the reflection axis of the reflective linear polarizer were parallel to each other, the angle between the absorption axis of the polarizer A and the slow axis of the first λ/4 plate was 45°, and the slow axis of the first λ/4 plate and the slow axis of the second λ/4 plate were orthogonal to each other in a case where the directions of the straight line L and the virtual lines L1 to L4 were observed from the position Z.

Comparative Example 1

In Comparative Example 1, a virtual reality display device "Huawei VR Glass" (manufactured by Huawei Technologies Co., Ltd.) was used.

The lens (the lens removed in Example 1) disposed closest to the viewing side of the virtual reality display device of Comparative Example 1 was a plano-convex lens with a convex surface on the viewing side, and an absorbing polarizer, a reflective linear polarizer, and a λ/4 plate were disposed in order from the viewing side on the plane side of the plano-convex lens.

That is, in the virtual reality display device of Comparative Example 1, a first absorbing polarizer, a reflective linear polarizer, a first λ/4 plate, a half mirror, a second λ/4 plate, a second absorbing polarizer, and an image display panel were disposed in order from the viewing side. Each of the absorbing polarizers, each of the λ/4 plates, the reflective linear polarizer, and the half mirror were all planar and disposed to be parallel to each other. Further, the absorption axis of each absorbing polarizer was disposed linearly in one in-plane direction.

As a result of observing the virtual reality display device of Comparative Example 1 from a separated position on the side of the convex surface of the plano-convex lens, the angle between the absorption axis of the first absorbing polarizer and the absorption axis of the second absorbing polarizer was 90° in a region which a perpendicular line drawn from the observation position to the first absorbing polarizer intersected a perpendicular line drawn from the observation position to the second absorbing polarizer. However, in a case where a direction separated from the region was observed from the observation position, the angle between the absorption axis of the first absorbing polarizer at the intersection with the straight line in the above-described direction and the absorption axis of the second absorbing polarizer at the intersection with the straight line in the above-described direction was not 90°.

Further, the above-described method of specifying the position Z was tested with respect to the virtual reality display device of Comparative Example 1, but the presence of the position Z satisfying the specific requirements was not able to be confirmed.

[Evaluation of Ghosts]

In each of the prepared virtual reality display devices, a black and white checkered pattern was displayed on the image display element, and the ghosts observed from the viewing side were visually evaluated.

As a result, in the virtual reality display device of Comparative Example 1, the image of the white display area was visually recognized as a ghost in a part of the black display area of the checkered pattern, and the checkered pattern was not clear. Particularly, in a case where the display image in the region near the peripheral portion was visually recognized, the influence of the ghosts was significant.

On the contrary, in the virtual reality display device of Example 1, ghosts caused by stray light were not visually recognized over the entire region of the lens, and the checkered pattern was clearly displayed. Even in the display image in a region close to the peripheral portion where the influence of the ghosts was significant in the virtual reality display device of Comparative Example 1, ghosts were not visually recognized similarly to the central portion of the display image.

EXPLANATION OF REFERENCES

10: optical element
20, 22, 30: image display device
24: housing
31, 34: absorbing polarizer
32: reflective polarizer
33, 300: half mirror
35, 500: image display element
100: polarizer A
200: reflective linear polarizer
202: reflective circular polarizer
400: polarizer B
600: first λ/4 plate
700: second λ/4 plate
S, V: ray

What is claimed is:

1. A method of producing an absorbing polarizer which has a plurality of regions where directions of absorption axes are different from each other and has a curved surface portion, the method comprising:
    a step of forming a layer of a composition for forming a photo-alignment film that contains a photo-alignment agent on a surface of a resin base material,
    a step of forming the alignment film by irradiating the layer with ultraviolet rays of linearly polarized light via a lens, and aligning the photo-alignment agent, and
    a step of coating a surface of an alignment film with a composition containing a liquid crystal compound and a dichroic substance,
    wherein the alignment film has a curved surface portion and a plurality of regions where directions of an alignment regulating force are different from each other.

2. The method of producing a polarizer according to claim 1,
wherein the step of coating the surface is a step of spray-coating the surface of an alignment film with the composition.

3. The method of producing a polarizer according to claim 1,
wherein the step of forming the layer of the composition for forming the photo-alignment film comprises a step of coating a surface of a planar resin base material with the composition for forming the photo-alignment film to form a coating film, and a step of molding the resin base material and the coating film into a curved surface shape.

4. An optical element comprising:
an absorbing polarizer A produced by the method of producing a polarizer according to claim 1; and
an absorbing polarizer B.

5. An image display device comprising:
the optical element according to claim 4; and
an image display element.

6. The image display device according to claim 5,
wherein a reflective linear polarizer, a first $\lambda/4$ plate, a half mirror, and a second $\lambda/4$ plate are provided between the polarizer A and the polarizer B in order from a side of the polarizer A.

7. The image display device according to claim 5,
wherein a first $\lambda/4$ plate, a reflective circular polarizer, a half mirror, and a second $\lambda/4$ plate are provided between the polarizer A and the polarizer B in order from a side of the polarizer A.

8. The image display device according to claim 7,
wherein the reflective circular polarizer has a cholesteric liquid crystal layer.

9. The image display device according to claim 5,
wherein the polarizer B is laminated on the image display element.

10. A virtual reality display device comprising:
the image display device according to claim 5.

11. An electronic viewfinder comprising:
the image display device according to claim 5.

* * * * *